United States Patent [19]
Clinton et al.

[11] Patent Number: 6,055,150
[45] Date of Patent: *Apr. 25, 2000

[54] MULTI-ELECTRODE ELECTROSTATIC CHUCK HAVING FUSES IN HOLLOW CAVITIES

[75] Inventors: Jon Clinton; Mark Contreras, both of San Jose; Anand H. Kumar, Milpitas; Shamouil Shamouilian, San Jose; You Wang, Sunnyvale; Surinder Bedi, Fremont, all of Calif.

[73] Assignee: Applied Materials, Inc., Santa Clara, Calif.

[ * ] Notice: This patent is subject to a terminal disclaimer.

[21] Appl. No.: 09/188,038

[22] Filed: Nov. 6, 1998

Related U.S. Application Data

[63] Continuation-in-part of application No. 08/965,121, Nov. 6, 1997, abandoned, which is a continuation-in-part of application No. 08/641,938, May 2, 1996, Pat. No. 5,751,537.

[51] Int. Cl.[7] .................................................... H02N 13/00
[52] U.S. Cl. ............................................. 361/234; 279/128
[58] Field of Search ................................... 340/638, 639; 324/550, 551, 555, 556; 361/233–235, 104; 337/414

[56] References Cited

U.S. PATENT DOCUMENTS

| | | | |
|---|---|---|---|
| 4,184,188 | 1/1980 | Briglia | 361/234 |
| 4,281,322 | 7/1981 | Nasu et al. | 340/638 |
| 4,368,452 | 1/1983 | Kerr, Jr. | 337/414 |
| 4,384,918 | 5/1983 | Abe | 156/643 |
| 4,480,284 | 10/1984 | Tojo | 361/234 |
| 4,502,094 | 2/1985 | Lewin et al. | 361/234 |
| 4,508,161 | 4/1985 | Holden | 165/1 |
| 4,514,723 | 4/1985 | Leal | 340/638 |
| 4,520,421 | 5/1985 | Sakitani et al. | 361/234 |
| 4,645,218 | 2/1987 | Ooshio et al. | 279/1 M |
| 4,724,510 | 2/1988 | Wicker et al. | 361/234 |
| 4,751,609 | 6/1988 | Kasahara | 361/234 |
| 4,945,345 | 7/1990 | Proctor et al. | 340/638 |
| 5,117,121 | 5/1992 | Watanabe et al. | 307/130 |
| 5,151,845 | 9/1992 | Watanabe et al. | 361/234 |
| 5,184,398 | 2/1993 | Moslehi et al. | 29/825 |
| 5,221,403 | 6/1993 | Nozawa et al. | 156/345 |
| 5,283,553 | 2/1994 | Ishii et al. | 340/664 |
| 5,463,526 | 10/1995 | Mundt | 361/234 |
| 5,539,609 | 7/1996 | Collins et al. | 361/234 |
| 5,542,559 | 8/1996 | Kawakami et al. | 216/67 |
| 5,751,537 | 5/1998 | Kumar et al. | 361/234 |

FOREIGN PATENT DOCUMENTS

| | | |
|---|---|---|
| 0692814 | 1/1976 | European Pat. Off. . |
| 0805487 | 11/1997 | European Pat. Off. . |
| 63-308340 | 12/1988 | Japan . |
| 2246136 | 10/1990 | Japan . |
| 3145151 | 6/1991 | Japan . |
| 513557 | 1/1993 | Japan . |
| 5291562 | 11/1993 | Japan . |
| 6244146 | 9/1994 | Japan . |

*Primary Examiner*—Fritz Fleming
*Attorney, Agent, or Firm*—Janah and Associates

[57] ABSTRACT

A failure resistant electrostatic chuck 20 for holding a substrate 35 during processing of the substrate 35 comprises one or more electrodes 25 covered by an insulator 30, the electrodes 25 capable of electrostatically holding a substrate 35 when a voltage is applied thereto. An electrical power bus 40 comprises one or more output terminals 45 that conduct voltage to the electrodes 25. The fuses 50 are positioned in hollow cavities 55 in the insulator 30, and electrically connect the electrodes 25 in series to the output terminals 45 of the power bus 40. Each fuse 50 can electrically disconnect an electrode 25 from an output terminal 45 when the insulator 30 covering the electrode 25 punctures and exposes the electrode 25 to a plasma process environment thereby causing a plasma current discharge to flow through the fuse 50.

32 Claims, 12 Drawing Sheets

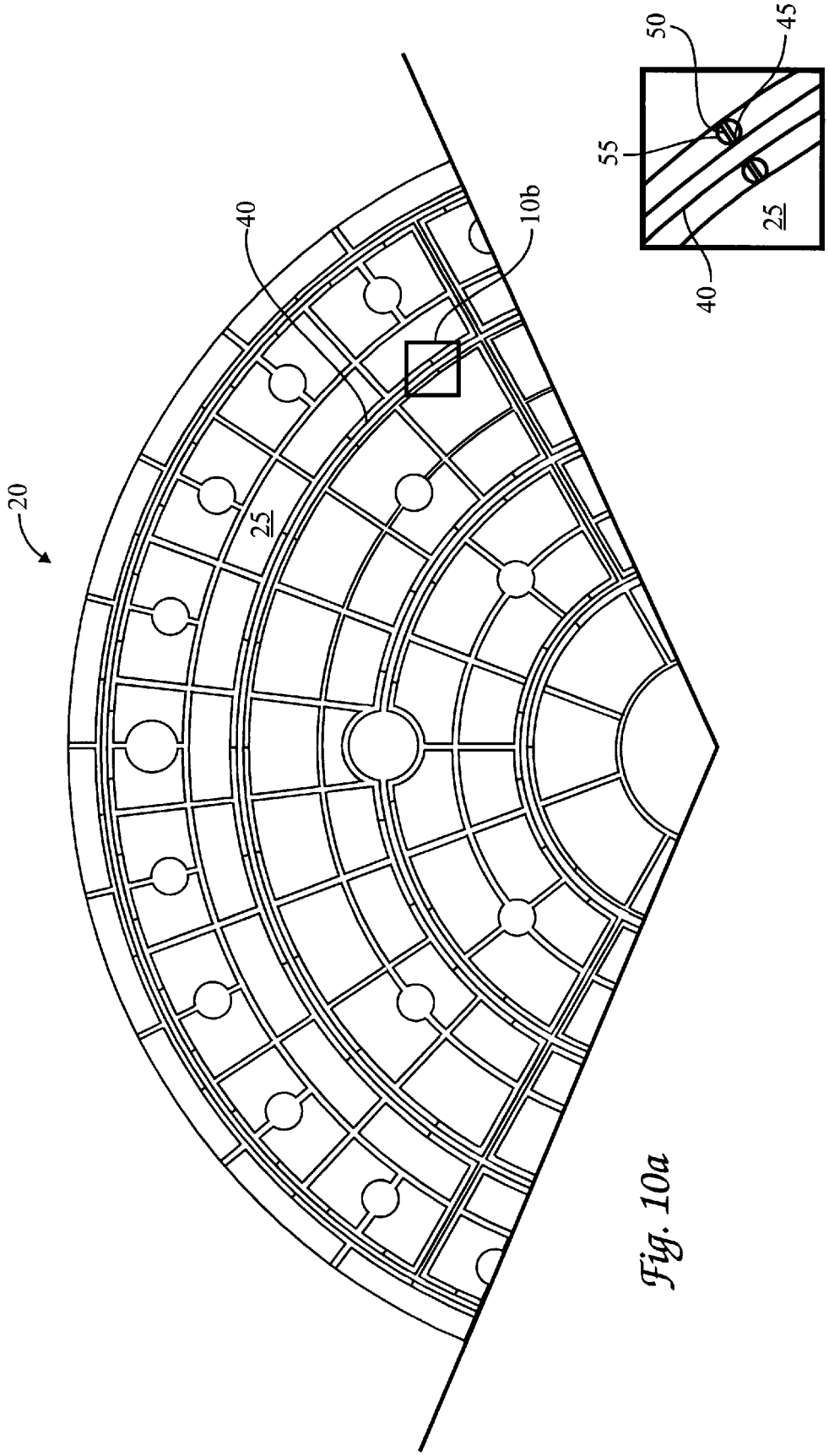

MULTI-ELECTRODE ELECTROSTATIC CHUCK HAVING FUSES IN HOLLOW CAVITIES

CROSS-REFERENCE

This application is a continuation-in-part of U.S. patent application Ser. No. 08/965,121, entitled "Multi-electrode Electrostatic Chuck Having Fuses In Hollow Cavities," filed Nov. 6, 1997, by Clinton, et al.; now abandoned which is a continuation-in-part of U.S. patent application Ser. No. 08/641,939, filed on May 2, 1996, now U.S. Pat. No. 5,751,537, entitled "Multielectrode Electrostatic Chuck With Fuses," issued May 12, 1998, by Kumar, et al.,—both of which are incorporated herein by reference.

BACKGROUND

The present invention is related to electrostatic chucks for holding substrates in process environments.

Electrostatic chucks are used to hold substrates, such as silicon wafers, during processing of the substrate in a process chamber. A typical electrostatic chuck includes an insulated electrode that is electrically biased with respect to the substrate by an electrical voltage. During processing of the substrate, process gas is introduced into the process chamber, and in certain processes, an electrically charged plasma is formed from the process gas. In monopolar chucks the electrical voltage applied to the electrode and the charged plasma species above the substrate induce opposing electrostatic charge in the electrode and substrate that results in an attractive electrostatic force that electrostatically holds the substrate to the chuck. In bipolar chucks, two or more electrodes are maintained at different electrical potentials to electrostatically hold the substrate in both plasma and non-plasma processes.

Typically, the electrostatic chuck comprises a metal electrode covered by a thin insulator layer that maximizes electrostatic attractive forces. However, the thin insulator layer can be punctured by sharp edged substrate fragments, or eroded in the process environment to expose the electrode of the chuck. Such puncturing is particularly likely to occur when the insulator is composed of a soft polymeric material that has low puncture resistance. Exposure of the electrode at even a single pinhole in the insulator can cause arcing between the electrode and plasma and require replacement of the entire chuck. Failure of the electrostatic chuck during processing of a substrate can result in loss of the entire substrate at a significant cost.

One solution to the puncturing problem is to make the chuck resistant to failure from erosion of the insulator by the use of a plurality of fuses, each fuse electrically connecting at least one electrode in series to a power bus that supplies the voltage to the electrodes of the chuck, as disclosed in commonly assigned U.S. Pat. No. 5,751,357, by Kumar et al. The fuses burn-out and electrically disconnect the electrodes from the power bus when the insulator punctures and exposes the electrodes to the plasma process environment because of the plasma discharge current that flows through the fuses. However, because the fuses are embedded in the insulator layer, the burned-out fuses can result in a link of conductive residue that can form a weak conductive pathway between the electrode and the power bus. The residual conductive pathway allows the plasma to continue to discharge through the fuse, causing plasma instabilities in the chamber that result in non-uniform processing of the substrate and/or movement of the substrate by weakening the electrostatic force holding the substrate.

It is desirable to have an electrostatic chuck that is resistant to failure from puncturing by substrate fragments, and from failure by erosion in erosive process environments. It is also desirable for the chuck to be tolerant to punctures to allow the chuck to continue holding a substrate even with multiple punctures in the insulator layer. It is further desirable to have an electrostatic chuck that tolerates erosion or failure of portions of an insulator covering the electrode without allowing plasma currents to continue to discharge through the electrode.

SUMMARY

The present invention provides a failure resistant electrostatic chuck for holding a substrate in a process environment, that tolerates failure of electrodes without allowing plasma to continue to discharge through the failed electrodes of the chuck. One version of the chuck comprises an insulator having a surface for receiving a substrate thereon. Embedded in the insulator is (i) an electrode for electrostatically holding a substrate upon application of voltage to the electrode; (ii) an electrical power bus comprising an output terminal for conducting the voltage to the electrode, and (iii) a fuse connecting in series the electrode to the output terminal from the power bus, the fuse positioned within an enclosed hollow cavity in the insulator. The fuse comprises an amperage rating sufficiently low to electrically disconnect the electrode from the output terminal, when the insulator punctures to expose the electrode to the plasma process environment thereby causing a current discharge from the plasma to flow through the fuse. Preferably, the hollow cavity surrounding the fuse comprises a surface area sized sufficiently large to receive debris from burn-out of the fuse without forming a conductive pathway between the electrode and the output terminal of the power bus.

In a preferred version, the electrostatic chuck comprises a plurality of electrodes, output terminals, fuses, and hollow cavities embedded within the insulator, to provide a redundancy of electrodes that continue to hold the substrate even if some of the electrodes are disconnected by the fuses. More preferably, the insulator of the chuck comprises multiple layers including a cover layer and a support layer. The support layer supports the electrodes, electrical power bus, and fuses. The upper surface of the cover layer comprises insulator for insulating the electrodes, and the lower surface of the cover layer comprising hollow cavities positioned around the fuses on the support layer.

In another version, the electrostatic chuck comprises at least one first insulator layer comprising a plurality of electrodes for electrostatically holding a substrate upon application of a voltage to the electrodes, the upper surface of the insulator layer adapted to receive a substrate thereon. One or more second insulator layers further comprise an electrical power bus having a plurality of output terminals for conducting the voltage to the electrodes, and a plurality of fuses positioned in hollow cavities in the insulator layers, each fuse provided for connecting in series at least one electrode to an output terminal of the power bus. The first and second insulator layers can be joined together to form a unitary structure or can be separate and non-contiguous from one another.

In another aspect, the present invention comprises a method for forming the failure resistant electrostatic chuck comprising electrodes connected via fuses enclosed in hollow cavities to output terminals from an electrical power bus. The method comprises the steps of (a) forming electrodes, electrical power buses, and fuses on an insulating support layer, (b) forming hollow cavities in an insulating cover layer, and (c) joining the insulating cover layer to the insulating support layer so that each hollow cavity is aligned or positioned over a fuse. The cover layer can comprise one or more of adhesive and insulating layer. Preferably, layers of electrical conductor and resistor material are deposited on the insulating support layer, and etched to form a plurality of electrodes, each electrode connected to an output terminal from a power bus via a fuse.

DRAWINGS

The features, aspects, and advantages of the present invention will become better understood with regard to the following description, appended claims, and accompanying drawings which illustrate versions of the invention, where:

FIG. 10a is a schematic top view of an electrode, power bus, and fuse assembly of an electrostatic chuck manufactured using the process illustrated in FIGS. 9a to 9g;

FIG. 10b is an enlarged schematic view of the inset box 10b of FIG. 10a showing details of the electrode, power bus, and fuse assembly;

DESCRIPTION

The present invention is useful for multi-electrode structures, such as capacitors, batteries, and electrostatic chucks. Although the present invention is illustrated in considerable detail in the context of an electrostatic chuck useful for holding substrates in process environments, many other versions of the invention should be apparent to those skilled in the art, without deviating from the scope of the invention. Therefore, the spirit and scope of the present invention should not be limited to the description of the preferred versions contained herein.

Figure 1:
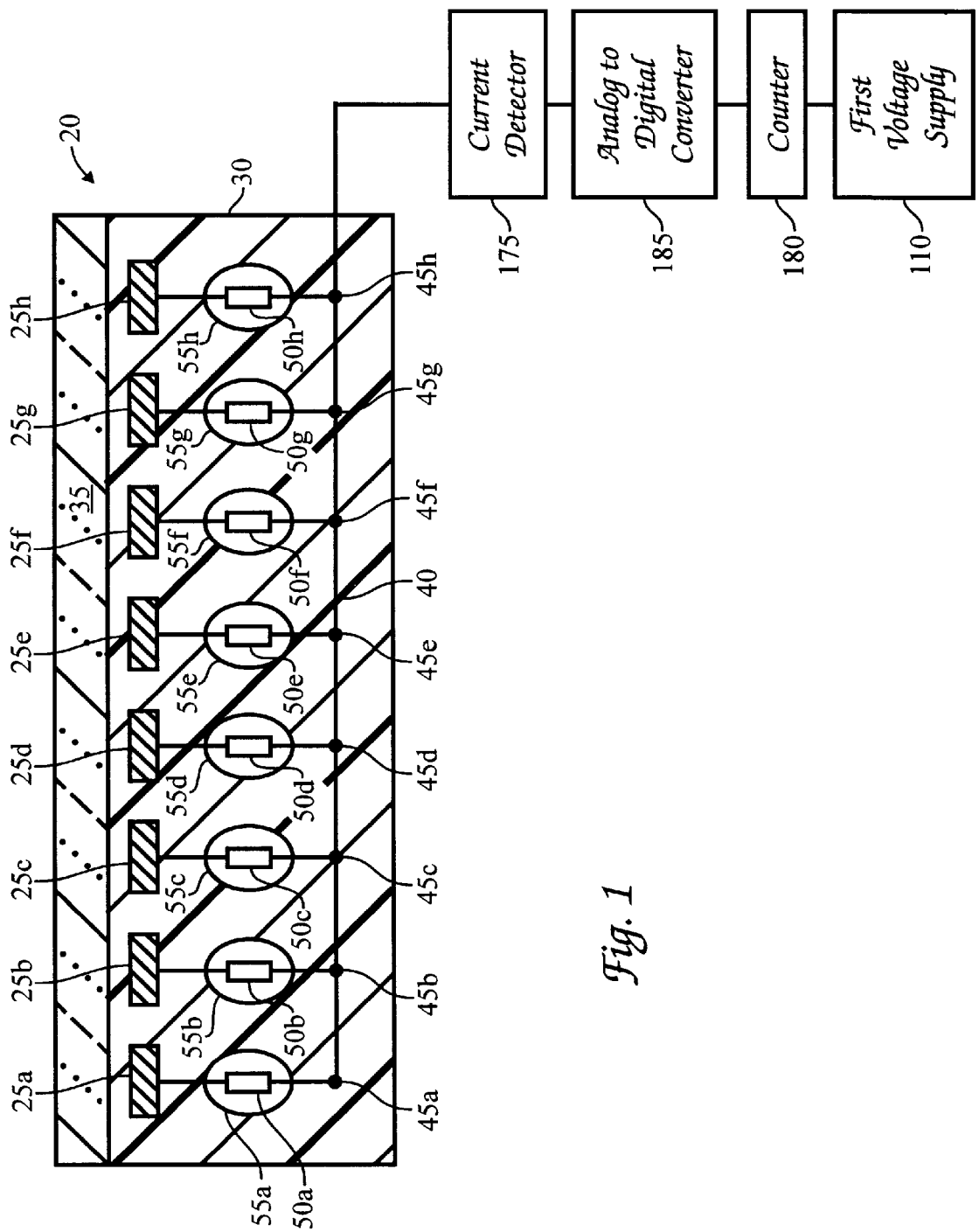
FIG. 1 is a partial sectional schematic side view of an embodiment of the electrostatic chuck according to the present invention.

As schematically illustrated in FIG. 1, an electrostatic chuck 20 of the present invention comprises a plurality of electrodes 25a–h, such as monopolar or bipolar electrodes, which are embedded in or covered by insulator 30. The electrodes 25a–h electrostatically hold a substrate 35 when a voltage is applied to the electrodes 25a–h. Either a single electrical potential or bias is applied to each individual segment of the electrode 25a–h, as shown in FIG. 1, or a different potential or bias is applied to each individual segment of the electrode, such as in a bipolar electrostatic chuck. In yet another embodiment, the electrodes 25 are biased in any variation of the above, i.e., a group of electrodes is supplied with one electrical potential and at least one other group of electrodes is supplied with a different potential. An electrical power bus 40 comprises one or more output terminals 45a–h for conducting voltage to the electrodes 25a–h. One or more fuses 50a–h are each positioned within enclosed hollow cavities 55a–h in the insulator 30. Each fuse (for example, fuse 50a) connects at least one electrode 25a in series to an output terminal 45a and electrically disconnects the electrode 25a from the output terminal 45a when the insulator 30 on the electrode punctures and exposes the electrode 25a to the plasma process environment causing a current to discharge from the plasma and flow through the electrode 25a and fuse 50a. Preferably, each of the hollow cavities 55a–h in the insulator 30 is aligned over a fuse and comprises a surface area sized sufficiently large to receive or contain debris from burn-out of a fuse 50a–h without forming a conductive pathway between the electrode 25a–h and the output terminal 45a–h of the power bus 40.

Figure 2:
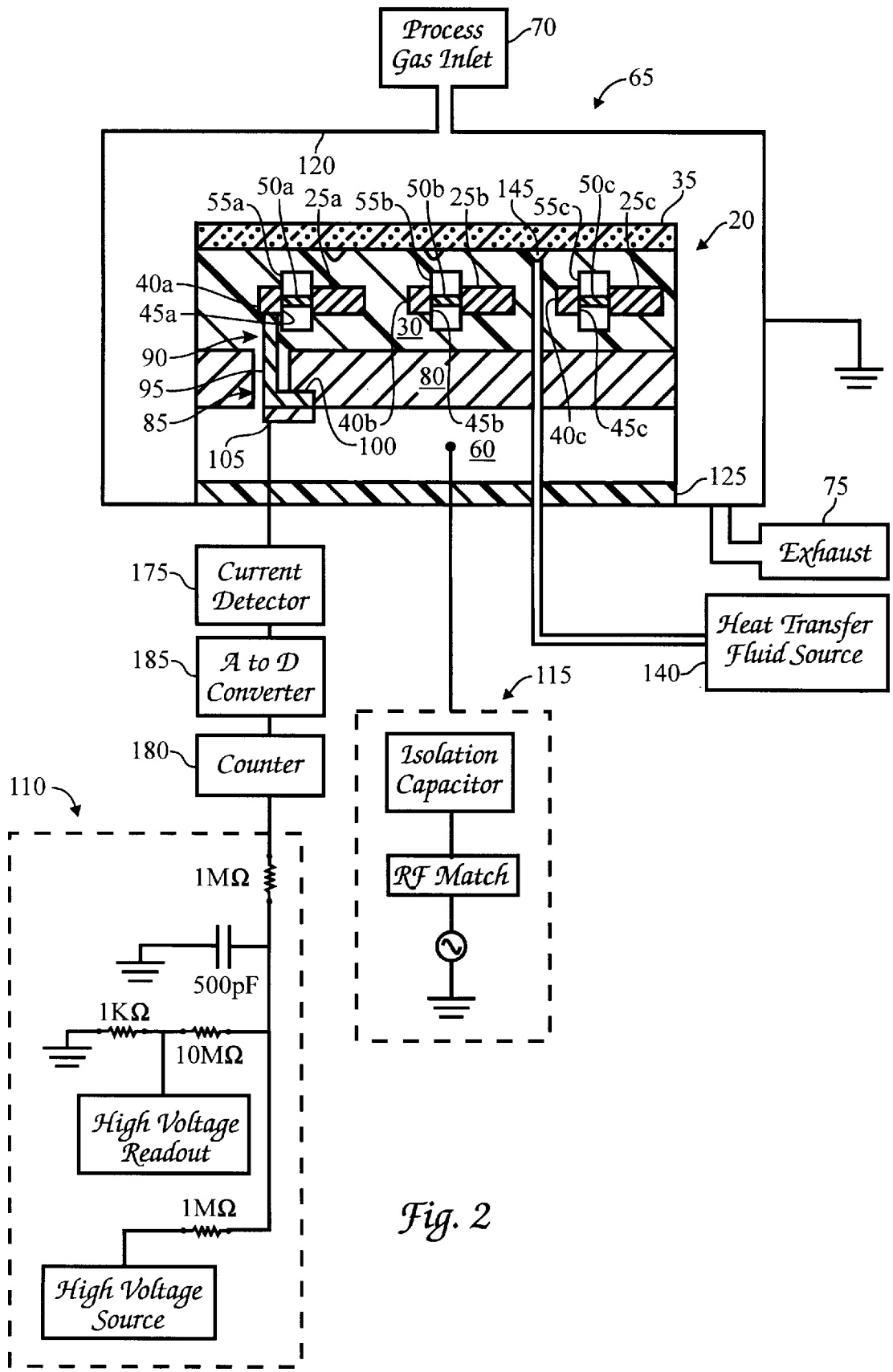
FIG. 2 is a partial sectional schematic side view of a process chamber showing operation of a monopolar electrostatic chuck according to the present invention.

As illustrated in FIG. 2, the electrostatic chuck 20 is secured on a support 60 in a process chamber 65 that forms an enclosure for processing the substrate 35. Optionally, the electrostatic chuck 20 comprises a base 80 with a bore 85 therethrough, that is useful for supporting the electrodes 25a–c and insulator 30. An electrical connector 90 electrically connects the power bus 40 to a voltage supply. The electrical connector 90 comprises (i) an electrical lead 95 that extends through the bore 85 of the base 80, and (ii) an electrical contact 100 that electrically engages a voltage supply terminal 105 at the interface between the base 80 and the support 60. A first voltage supply 110 provides an electrical voltage to the voltage supply terminal 105 for operating the chuck 20. The first voltage supply 110 typically includes a circuit which comprises a high voltage DC source of about 100 to 3000 volts, connected to a high voltage readout, through a 10 MΩ resistor. A 1 MΩ resistor in the circuit limits current flowing through the circuit, and a 500 pF capacitor is provided as an alternating current filter.

A second voltage supply 115 is connected to the support 60 in the process chamber 65. At least a portion of the support 60 is typically electrically conductive and functions as a process electrode, or cathode, for forming a plasma in the chamber 65. The second voltage supply 115 electrically biases the support 60 with respect to an electrically grounded surface 120 in the chamber 65, to form an electric field that generates or energizes a plasma formed from a process gas in the chamber 65. An insulative flange 125 is disposed between the support 60 and the grounded surface 120 to electrically isolate the support 60 from the grounded surface 120. Typically, the second voltage supply 115 comprises an RF impedance that matches the impedance of the process chamber 65 to the impedance of the line voltage, in series with an isolation capacitor.

To operate the chuck 20, the process chamber 65 is evacuated and maintained at a sub-atmospheric pressure. A substrate 35 is placed on the chuck 20, and the electrodes 25a–c of the chuck 20 are electrically biased with respect to the substrate 35 by the first voltage supply 110. Thereafter, process gas is introduced into the chamber 65 via a gas inlet 70, and plasma is formed from the process gas by activating the second voltage supply 115 or by using alternative plasma generator sources, such as inductor coils (not shown). In the operation of monopolar electrode chucks (i.e., when a single potential is applied to the electrodes of the chuck) the voltage applied to the electrodes 25a–c causes electrostatic charge to accumulate in the electrodes 25a–c, and the plasma in the chamber 65 provides electrically charged species having opposing polarity which accumulate in the substrate 35. The accumulated opposing electrostatic charge results in an attractive electrostatic force that electrostatically holds the substrate 35 to the chuck 20.

To regulate the temperature of the substrate 35 held on the chuck 20, a heat transfer fluid source 140 can be used to supply heat transfer fluid to grooves 145 in the insulator 30 of the chuck. The substrate 35 held on the chuck 20 covers and seals the grooves 145 and prevents the heat transfer fluid from leaking out. The heat transfer fluid in the grooves 145 can be used to heat or cool the substrate 35 to regulate the temperature of the substrate 35 and maintain the substrate 35 at constant temperatures during processing. Typically, the grooves 145 form a pattern of intersecting channels extending through the insulator 30. The heat transfer fluid is typically a gas such as helium which is held at a pressure of about 1 to 10 Torr in the grooves.

The multi-electrode chuck 20 of the present invention is resistant to failures occurring from erosion or puncture of the insulator 30 on the electrodes 25a–c. When a sharp-edged fragment punctures the portion of the insulator 30 that covers a particular electrode (for example electrode 25a), the electrostatic charge in the substrate 35 flows through the exposed electrode 25a and through the fuse 50a connected to the electrode. The current flowing through the fuse 50a as a result of the electrostatic discharge causes the fuse 50a to automatically switch-off in a relatively short time to electrically disconnect the electrode 25a from the output terminal 45a of the electrical power bus 40. However, the remaining electrodes 25b–c which are still insulated by the insulator 30 provide a large contact area of electrodes that continues to operate and electrostatically hold the substrate 35 to the chuck 20. Thus, each assembly of a fuse 50a and a corresponding electrode 25a functions as an independently operated micro electrostatic chuck having a small contact area, and obtains its power supply from an independently powered output terminal 45 of the power bus 40. In this manner, the electrostatic chuck 20 of the present invention provides significant advantages by continuing to hold the substrate 35 and resisting catastrophic failure even when the portion of an insulator 30 covering an electrode 25 is punctured or eroded.

Figure 3A:
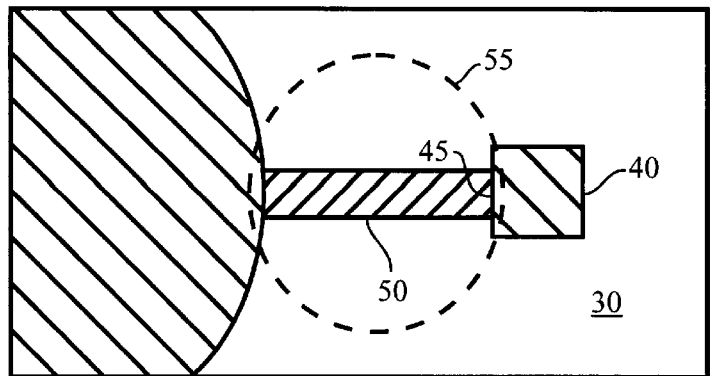
FIG. 3a is a partial sectional schematic top view of a hollow cavity in the insulator of the chuck of the present invention.
Figure 3B:
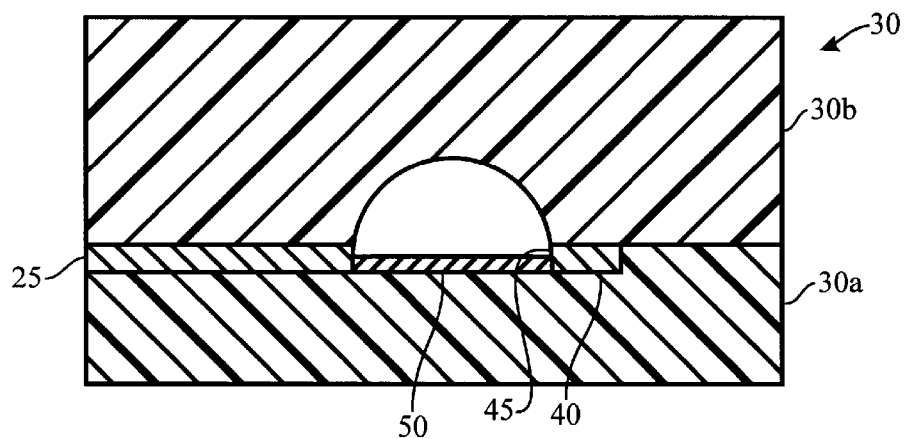
FIG. 3b is a partial sectional schematic side view of an electrostatic chuck of the present invention showing a plurality of layers forming the insulator and a hemispherical hollow cavity in the insulator.

Furthermore, as illustrated in FIGS. 3a and 3b the fuses 50 are positioned within the hollow cavities 55 in the insulator layer 30. Without hollow cavities 55 around the location of the fuses 50, the fuses burn-out to form debris particles or molten liquid in the insulator 30 that remain in close contact to form conducting pathways that lead to arcing across the debris even when the debris is only slightly conductive. The hollow cavities 55 enclose the fuses 50 and comprise a volume having a surface area sized sufficiently large to receive debris from burn-out or melting of the fuse 50 without forming a conductive pathway between the electrode 25 and the output terminal 45 of the power bus 40.

Figure 3C:
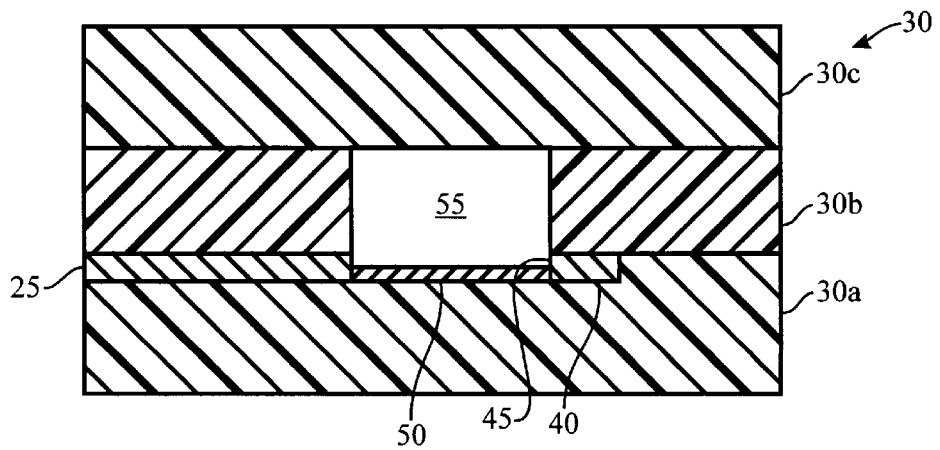
FIG. 3c is a partial sectional schematic side view of an electrostatic chuck of the present invention showing a plurality of layers forming the insulator and a cylindrical hollow cavity in the insulator.

Preferably, the hollow cavities 55 comprise volumes having a width (which could be any dimension including a diameter, height, depth or width) of about 0.25 to about 5 times the length of the fuses 50, and more preferably from about 0.5 to about 2 times the length of the fuse. Preferably, the volume of the enclosed hollow cavities 55 is from about 0.00001 mm$^3$ (0.6 mils$^3$) to about 10 mm$^3$ ($\cong$600,000 mils$^3$), and more preferably from about 0.00016 mm$^3$ ($\cong$10 mils$^3$) to about 5 mm$^3$ ($\cong$300,000 mils$^3$). More preferably, the hollow cavities are shaped in the form of flat, disc-like cylinders having a height of about 0.01 mm ($\cong$0.5 mils) to about 0.25 mm ($\cong$10 mils), and a diameter of about 0.1 mm ($\cong$5 mils) to about 5 mm ($\cong$200 mils). The surface area of the cavities 55 should be sufficiently large to receive fuse debris over a spread out surface region that reduces the possibility of conducting linkages from forming in the debris. Preferably, the surface area of the hollow cavities 55 is from about 0.001 mm$^2$ ($\cong$15 mils$^2$) to about 100 mm$^2$ ($\cong$155,000 mils$^2$), and more preferably from about 0.03 mm$^2$ ($\cong$50 mils$^2$) to about 45 mm$^2$ ($\cong$70,000 mils$^2$). For example, as illustrated in FIGS. 3a and 3c, the hollow cavities 55 in the insulator 30 can comprise a cylinder having a diameter about equal to the length of the fuse 50 and a height equal to the half the combined thickness of the top insulator layers 30b and 30c; or a hemispherical or spherical shape having a radius equal to about half the fuse length (as shown in FIG. 3b).

Referring to FIG. 3b, for ease of manufacture, the insulator 30 preferably comprises a plurality of layers including first and second layers. A first support layer 30a supports the electrodes 25, power bus 40, output terminals 45, and fuses 50. A second cover layer 30b covers the electrodes 25, power bus 40, output terminals 45, and fuses 50, and comprises the plurality of hollow cavities 55 in the insulator layer that are positioned around the fuses 50. The advantage of this version is to allow the fuses 50 and electrodes 25 to be formed directly on the unbroken planar surface of the support layer 30a; while the cavities 55 can be formed in the cover layer 30b. Also, the layers can be fabricated from different materials or in different thicknesses, to provide different dielectric, semiconducting or insulating properties in the two layers. For example, one of the cover layers 30c can be fabricated from a semiconducting material to form Johnsen-Rahbek-type electrostatic chucks in which the electrostatic charge leaks from the electrode 25 and accumulates in the material to form electrostatic charge below the surface of the chuck 20; while the lower layer 30b is fabricated from a more insulating material. In another embodiment shown in FIG. 3c, a second cover layer 30b having the plurality of hollow cavities 55 positioned around fuses 50, comprises an adhesive layer that joins a third insulating layer 30c covering the adhesive layer 30b to the support layer 30a.

A bipolar version of the electrostatic chuck 20 of the present invention will be described referring to the illustrative embodiment of FIG. 4. In the bipolar version, the chuck 20 comprises an insulator 30 covering a first group of electrodes 146 and a second group of electrodes 148 that are sized and configured to serve as bipolar electrodes. The groups of electrodes 146, 148 are capable of electrostatically holding a substrate 35 when a voltage is applied to the electrodes. A first power bus 40a having a first set of output terminals 45a provides voltage to the first group of electrodes 146. A second power bus 40b having a second set of output terminals 45b provides voltage to the second group of electrodes 148. A plurality of fuses 50a electrically connect electrodes 25a in series to output terminals 45a from power buses 40a and 40b. Each fuse 50a is positioned within an enclosed hollow cavity 55a in the insulator 30, and electrically disconnects the electrodes 25a from the output terminals 45a when the insulator 30 on an electrode punctures and exposes the electrode to the process environment causing a plasma discharge current to flow through the electrode and the associated fuse 50.

In the bipolar version, the first voltage supply 110 provides a differential electrical voltage to the first and second power buses 40a and 40b. In a preferred configuration, the first voltage supply 110 comprises two DC power supplies that provide a negative voltage to the first electrodes 146 and a positive voltage to the second electrodes 148 to maintain the electrodes at a differential electric potential relative to one another. The opposing electric potentials of the groups of electrodes 146 and 148 induce opposing electrostatic charges in the groups of electrodes 146 and 148, and in the substrate 35 held to the chuck 20, without use of a plasma in the process chamber 65, causing the substrate 35 to be electrostatically held to the chuck 20. Bipolar electrode configurations are advantageous for non-plasma processes in which there are no charged plasma species to serve as charge carriers for electrically biasing the substrate 35.

Alternate versions of the chuck 20 that provide ease of fabrication, increased reliability, and maximization of the electrostatic clamping force generated by the electrodes will now be described. In the version illustrated in FIG. 5, the electrical power bus 40 comprises a planar conductive layer spaced apart from the electrodes 25 that provides a voltage for operating all of the electrodes 25. Each fuse 50 electrically connects, in series, at least one electrode segment 25 to the power bus 40. Preferably, the fuses 50 comprise a resistive coating 150 on a hole 155 that extends between an electrode 25 and the planar conductive layer, the resistive coating 150 comprising, for example, a thin coating of a conductive or resistive material that serves as a resistor element. This version has certain advantages of fabrication, because the resistive fuse elements can be easily fabricated by depositing the resistive coating 150 on holes 155 formed in an insulator 30 layer covering the planar conductive layer; and the holes can be shaped and sized sufficiently large to prevent burned-out or melted residue from the fuse 50 to coagulate into conductive linkages.

Figure 6:
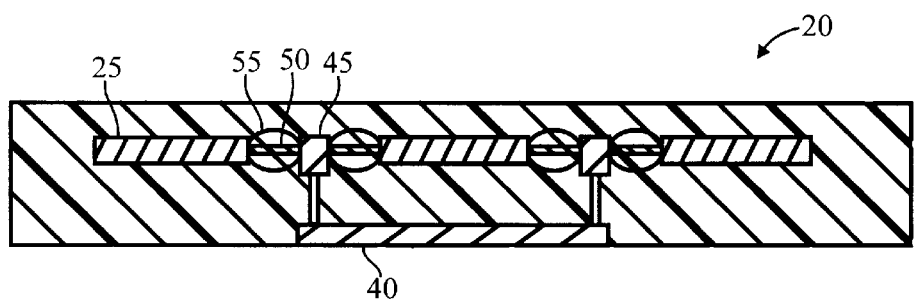
FIG. 6 is a cross-sectional schematic side view of another embodiment of an electrostatic chuck according to the present invention showing an electrical power bus below the electrodes.

In the version shown in FIG. 6, the output terminals 45 of the electrical power bus 40 are substantially coplanar with the electrodes 25. The electrodes 25 are coplanar so that the electrostatic contact area of the electrodes 25 lie in a single plane. The output terminals 45 are positioned coplanar to the electrode plane, between, and spaced apart from, the electrodes 25. This arrangement allows the fuses 50 to be positioned in between the electrodes 25, thereby reducing the total thickness of the electrode 25 and insulator layer 30, and maximizing the attractive electrostatic force of the chuck 20.

Figure 7:
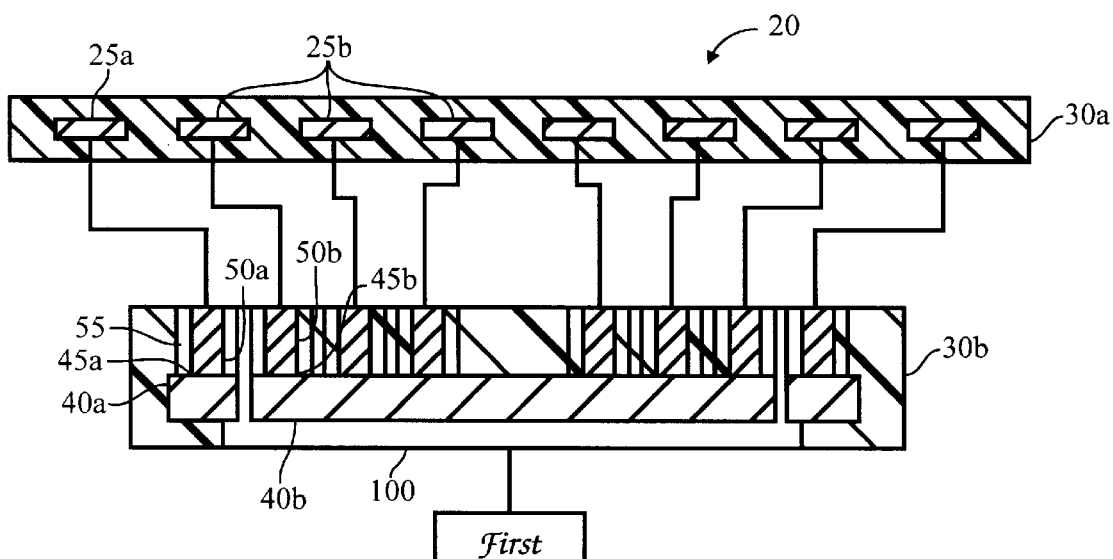
FIG. 7 is a cross-sectional schematic side view of another embodiment of an electrostatic chuck according to the present invention showing a first insulator having a plurality of electrodes and a second insulator covering the fuses.
Figure 8:
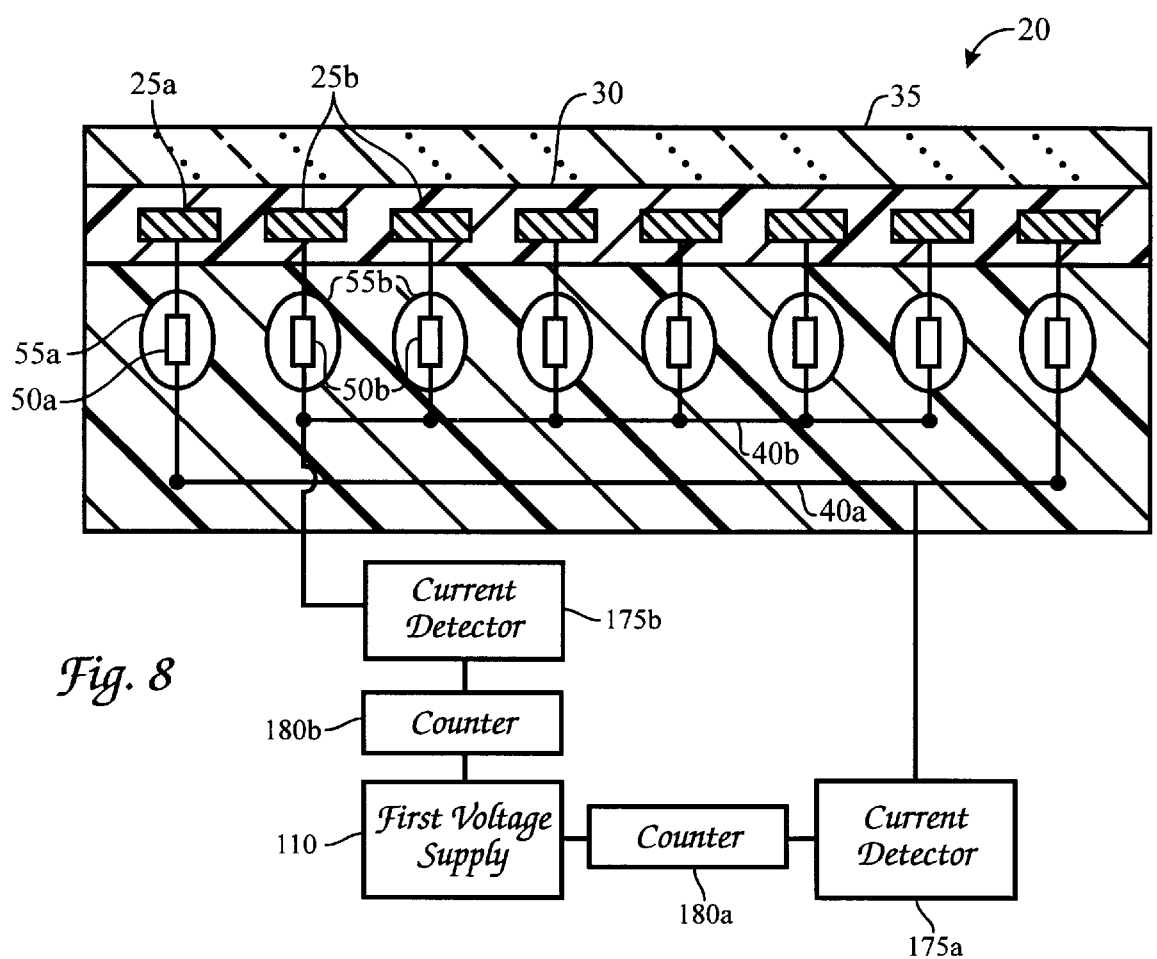
FIG. 8 is a cross-sectional schematic side view of another embodiment of an electrostatic chuck according to the present invention.

In the version shown in FIGS. 7 and 8, the chuck 20 comprises (i) one or more peripheral electrodes 25a in a periphery of the insulator 30, and (ii) one or more central electrodes 25b in central portion of the insulator 30. A first power bus 40a having a first set of output terminals 45a provides voltage to the peripheral electrodes 25a, and the second power bus 40b having a second set of output terminals 45b provides voltage to the central electrodes 25b. Fuses 50a–b electrically connect the electrodes 25a–b in series to output terminals 45a–b from the power buses 40a and 40b, as shown. The fuse 50a electrically disconnects the peripheral electrode 25a from the power bus 40a when any one peripheral electrode 25a is exposed to the process environment. This version shown in FIG. 8 allows separate monitoring and supplying of voltage to the peripheral electrodes 25a and central electrodes 25b. The peripheral electrodes 25a are particularly important when heat transfer fluid is used to regulate the temperatures of the substrate 35 held on the chuck 20, because the peripheral electrodes 25a seal the periphery of the chuck preventing leakage of heat transfer fluid. When the peripheral electrodes 25a fail, the heat transfer fluid held below the substrate leaks out, causing excessive heating and resultant damage to the periphery of the substrate. This chuck configuration allows application of higher voltage to the peripheral electrodes 25a to provide increased electrostatic holding force at the periphery of the chuck 20, or replacement of the chuck, if one or more of the peripheral electrodes 25a is exposed to the plasma environment.

In any of the versions described herein, and as illustrated in FIG. 7, the electrostatic chuck 20 can comprise at least one first insulator 30a having a plurality of electrodes 25a–b for electrostatically holding a substrate upon application of a voltage to the electrodes. The upper surface of the insulator 30a is a flat surface shaped and sized to receive a substrate thereon. One or more second insulators 30b further comprise a single or multiple electrical power buses 40a and 40b each of which comprises a plurality of output terminals 45a–b that conduct voltage to the electrodes. A plurality of fuses 50a–b are positioned in hollow cavities in the second insulator 30b. Each fuse 50a–b connects in series at least one electrode 25a–b to an output terminal 45a–b of the power buses 40a and 40b. The first insulator 30a and second insulator 30b can be joined together to form a unitary structure or can be separate and non-contiguous structures.

Another aspect of the invention provides a system for early detection, and optional counting, of the number of electrode failures. In this system, a current detector 175 is electrically connected in series to the electrical power bus 40, as shown in FIG. 1, to detect the flow of current through the fuses 50a–h. When an insulator 30 punctures and exposes an electrode 25a to the process environment, the charged plasma ions discharge through the electrode to provide a current that flows through the electrode 25a and contiguous fuse 50a. The current detector 175 detects the current before the fuse 50a electrically disconnects the electrode 25a from the output terminal 45a of the power bus 40. A suitable current detector 175 comprises an ammeter connected in series to the electrical power bus 40. Monitoring of the current surges through the current detector 175 provides an indication of the number of electrodes 25a–h exposed to the process environment or the number of disconnected electrodes 25a–h. In this manner, the current detector 175 can be used to provide early warning of the failure of one or more electrodes 25, to allow replacement of the chuck before catastrophic failure occurs during a processing cycle.

Preferably, an electrical counter 180 is connected to the current detector 175 to count the number of current surges through the current detector 175 to provide an estimate of the number of electrodes 25a–h exposed to the process environment, or the number of disconnected electrodes 25a–h. The counter 180 can be a conventional counter capable of counting the number of current discharges through the current detector 175. A counter typically comprises a register that counts the impulses generated by an analog-to-digital convertor and generates a position reading. Optionally, an analog-to-digital convertor 185 is used in series before the counter 180 to convert the analog current output to a digital current output. A typical analog-to-digital convertor 185 comprises an electronic circuit that receives a magnitude-scaled analog voltage and generates a binary-coded number proportional to the analog input. The analog-to-digital convertor 185 provides the binary output indicative of the analog input at precise repetitive time intervals. Conventional electrical counters and analog-to-digital converters can be used.

In the version of the chuck illustrated in FIG. 8, separate current detectors 175a and 175b, and optionally separate electrical counters 180a and 180b, are used to detect current flow in the peripheral electrodes 25a and central electrodes 25b of the chuck 20, respectively. The use of two current detectors allows separate detection of failure of the peripheral electrodes 25a and central electrodes 25b. In this manner, the current detector 175a can be used to provide early warning of the failure of one or more peripheral electrodes 25a, to allow replacement of the chuck before the chuck 20 fails during a processing cycle.

The different features and components of the chuck 20 and illustrative methods of fabricating the chuck will now be described. However, other methods of fabrication can be used to form the chuck 20, and the present invention should not be limited to the illustrative methods described herein.

As shown in FIG. 2, the base 80 of the chuck 20, which is used to support the electrodes 25a–c and insulator 30, is typically shaped and sized to correspond to the shape and size of the substrate 35 to maximize heat transfer and provide a wide holding surface. For example, if the substrate 35 is disk shaped, a right cylindrically shaped base 80 is preferred. Typically, the base 80 is of aluminum and has a cylindrical shape with a diameter of about 100 mm to 225 mm, and a thickness of about 1.5 cm to 2 cm. The top and bottom surfaces of the plate are ground using conventional grinding techniques, until the surface roughness of the plate is less than 1 $\mu$m, so that the base 80 can uniformly contact the support 60 and the substrate 35, to allow efficient thermal transfer between the substrate 35 and the support 60. The base 80 also has bores sized sufficiently large to insert the electrical connector 90 therethrough with minimal clearance, a suitable clearance being less than about 5 mm.

The insulator 30 can be a unitary insulator 30 sheet sized sufficiently large to cover and enclose all the electrodes 25a–c, fuses 50a–c, output terminals 45a–c, and the electrical power buses 40a–c of the chuck 20 as shown in FIG. 2. Alternatively the insulator could be formed from a plurality of layers as shown in FIGS. 3b–c. The resistivity of the insulator 30 should be (i) sufficiently low to allow rapid electrostatic charge accumulation and dissipation to provide a rapid response time, and (ii) sufficiently high to prevent leakage of the voltage applied to the electrodes 25a–c which can damage the devices formed on the substrate 35. Typically, the insulator 30 has a resistivity ranging from about $10^{13}$ $\Omega$ cm to $10^{20}$ $\Omega$ cm, and a dielectric constant of at least about 3, and more preferably at least about 4. A suitable thickness of the insulator 30 depends on the electrical resistivity and dielectric constant of the insulator. For example, when the insulator 30 has a dielectric constant of about 3.5, the thickness of the insulator 30 is typically about 10 $\mu$m to about 500 $\mu$m, and more typically from about 100 $\mu$m to about 300 $\mu$m. Suitable insulator 30 materials have dielectric breakdown strengths of typically at least about 3.9 volts/micron (100 volts/mil), and more typically at least about 39 volts/micron (1000 volts/mil). In a preferred configuration, the insulator 30 comprises a two layer laminate structure, that includes (i) a first insulator layer 30a below the electrodes 25, and (ii) a second layer insulator 30b over the electrodes 25, as illustrated in FIG. 3b. Preferably, each insulator layer 30a–b has a substantially equivalent thicknesses ranging from about 50 $\mu$m to about 100 $\mu$m.

Preferably, the insulator 30 comprises an electrically insulative polymeric material, such as polyimide, polyketone, polyetherketone, polysulfone, polycarbonate, polystyrene, nylon, polyvinylchloride, polypropylene, polyethersulfone, polyethylene terephthalate, fluoroethylene propylene copolymers, cellulose, triacetates, silicone, and rubber. More preferably, the insulator 30 comprises polyimide having a high dielectric breakdown strength, ranging from about 200 to about 400 volts/$\mu$m (5,000 to 10,000 volts/mil), which allows use of thin insulator 30 layers thereby maximizing electrostatic attractive force. Also, polyimide is resilient enough to deform slightly under the electrostatic clamping pressure to provide enhanced heat transfer when a heat transfer fluid is introduced in the microscopic gap between the substrate 35 and the resilient polyimide. Polyimide dielectric layers are typically formed by spin coating or bonding of a polyimide film over an electrode 25.

Alternatively, the insulator 30 can comprise a ceramic material, including (i) oxides such as $Al_2O_3$, BeO, $SiO_2$, $Ta_2O_5$, $ZrO_2$, CaO, MgO, $TiO_2$, $BaTiO_3$, (ii) nitrides such as AlN, TiN, BN, $Si_3N_4$), (iii) borides such as $ZrB_2$, $TiB_2$, $VB_2$, $W_2B_3$, $LaB_6$, (iv) suicides such as $MoSi_2$, and (v) diamond. The ceramic insulator is typically formed by either sputtering, flame spraying, CVD, or by solution coating, a thin ceramic film onto the electrode surface. Alternatively, the ceramic insulator can be formed by sintering a ceramic block with the electrodes 25 embedded therein.

Preferably, the insulator 30 is resistant to temperatures in excess of 50° C., and more preferably in excess of 100° C., so that the chuck 20 can be used for high temperature processes. Also, preferably, the insulator 30 has a high thermal conductivity so that heat generated in the substrate 35 during processing can dissipate through the chuck 20, a suitable thermal conductivity being at least about 0.10 Watts/m/K. Additionally, a protective coating (not shown) can be applied on the insulator 30 to protect the insulator 30 from chemical erosion when the chuck 20 is used in erosive processing environments.

The electrodes 25 are made from an electrically conductive material, such as for example, metals such as copper, nickel, chromium, aluminum, and alloys thereof. Typically, the thickness of the electrodes 25 is from about 1 $\mu$m to about 100 μμm, and more typically from 1 μm to 50 μm. Preferably, each electrode 25 comprises a contact area of from about $10^{-4}$ to $10^{-1}$ times the area of the substrate 35. For a substrate 35 having a diameter of 200 to 300 mm (6 to 8 inches), preferably each segment of the electrode 25 comprises a contact area of at least about 20 mm$^2$, and more preferably from about 50 to about 1000 mm$^2$.

The shape and size of the area covered by the electrodes 25 varies according to the size and shape of the substrate 35. For example, as shown in FIG. 10a, if the substrate 35 is disk shaped, the segments of the electrodes 25 are arranged in a disk shaped configuration to maximize the total area of the electrode 25 below the substrate 35. Preferably, the electrodes 25 cover a total area of about 50 to about 500 cm$^2$, and more typically from 80 to 380 cm$^2$.

Figure 4:
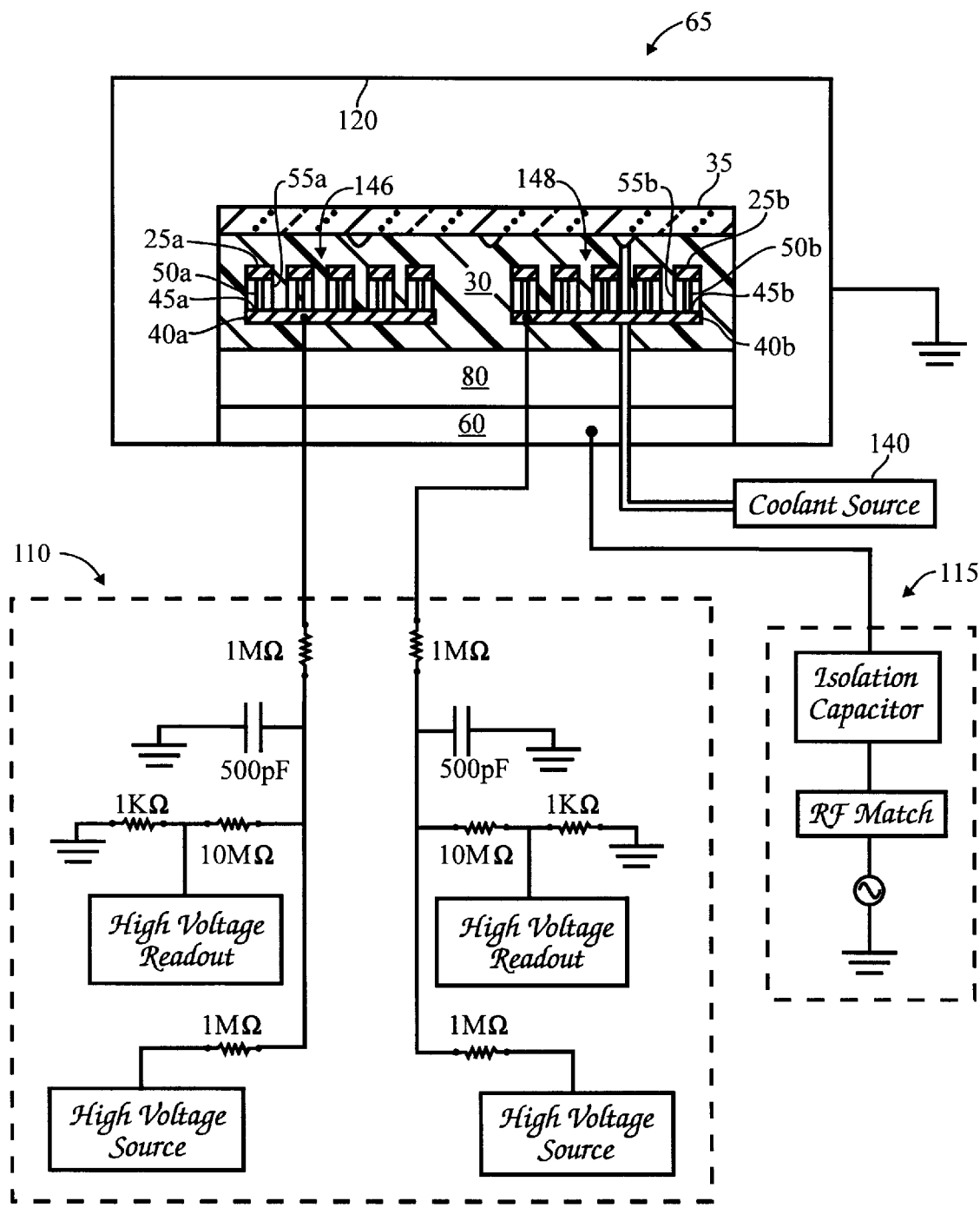
FIG. 4 is a partial sectional schematic side view of a process chamber showing operation of a bipolar electrostatic chuck of the present invention.
Figure 11:
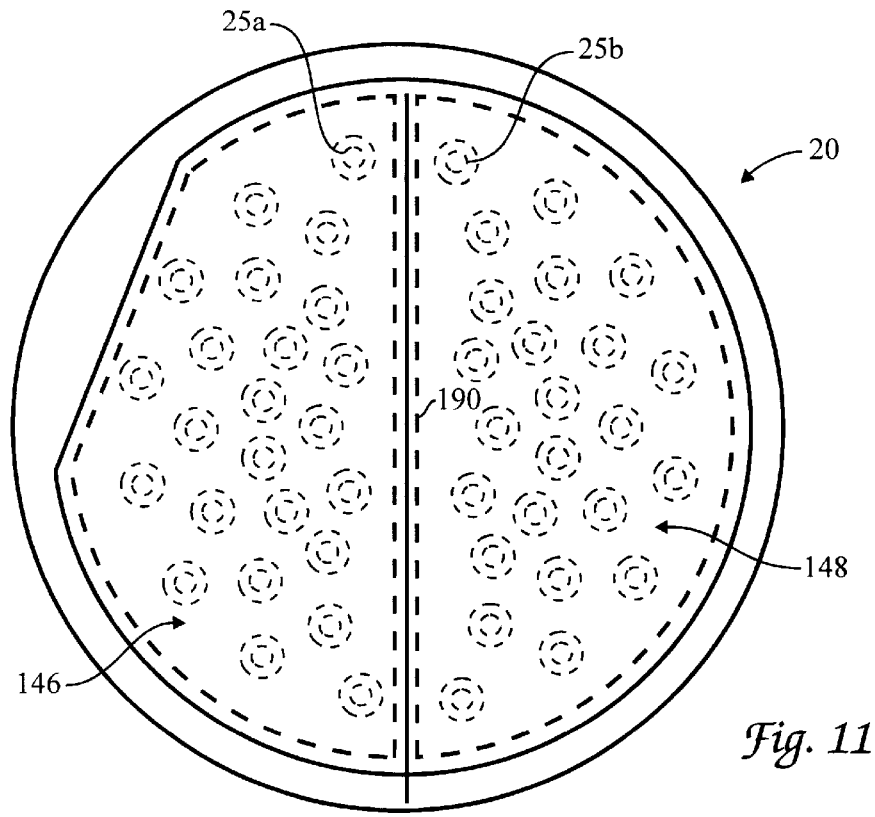
FIG. 11 is a schematic top view of a bipolar electrostatic chuck according to the present invention having two semi-circular groups of electrodes.
Figure 12:
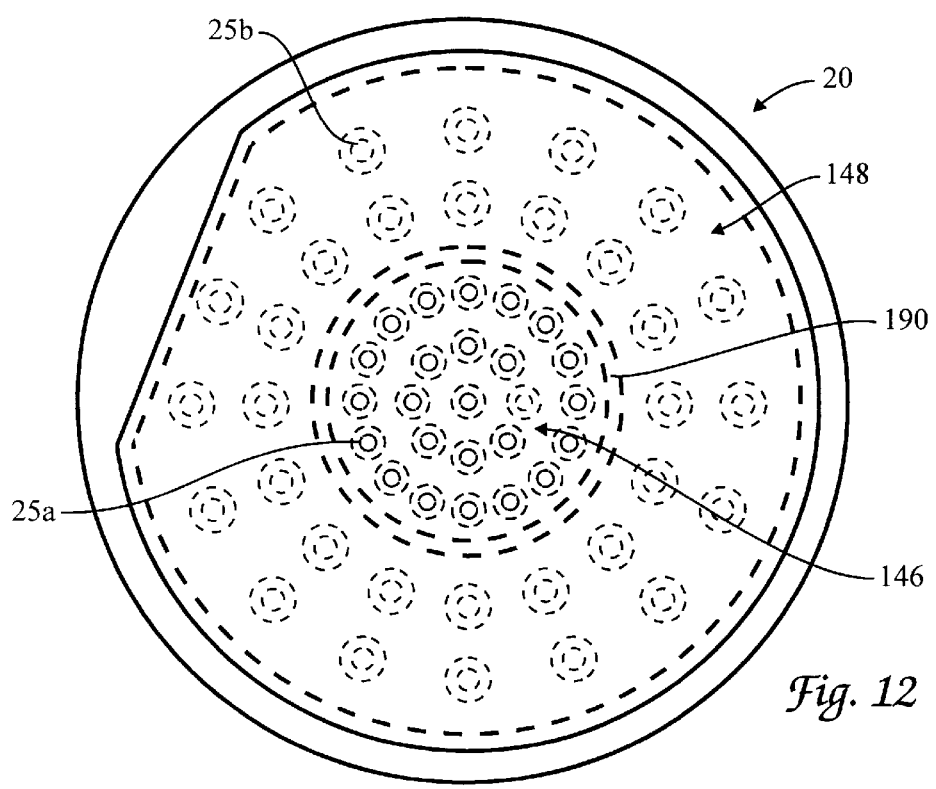
FIG. 12 is a schematic top view of another bipolar electrostatic chuck according to the present invention having a double ring electrode configuration.

For the bipolar electrode configurations shown in FIG. 4, the contact areas of each group of electrodes 146 and 148 are substantially equivalent and coplanar to one another, so that the electrodes generate equivalent electrostatic clamping forces on the substrate 35. Typically, the total contact area of each group of electrodes (or electrode segments) is from about 50 to about 250 cm$^2$, and more preferably from about 100 to about 200 cm$^2$. The first group of electrodes 146 and second group electrodes 148 can each comprise a semicircular area, as shown in FIG. 11. Alternatively, the first group of electrodes 146 can comprise at least one inner ring of electrodes, and the second group of electrode 148 can comprise at least one outer ring of electrodes, as shown in FIG. 12. Electrical isolation voids 190 are used to electrically isolate the groups of electrodes 146, 148 from one another. In one advantageous configuration, the electrical isolation voids 190 are sized and configured to serve as grooves for holding heat transfer fluid for regulating the temperature of the substrate 35 on the chuck 20. The grooves can be formed in the isolation voids 190 by cutting through the insulator 30 overlying the isolation void so that the grooves extend partially through the insulator 30, or the insulator 30 can recede into the isolation voids 190 to form grooves positioned between the electrodes 25a–c as shown in FIG. 2. This configuration allows use of the isolation voids 190 between the electrodes to hold heat transfer fluid without necessitating additional grooves to be cut through the electrodes, thereby maximizing the effective area and electrostatic force of the electrodes 25.

Electrical connectors 90 are used to electrically connect the electrical power bus 40, or the first and second power buses 40a, 40b, to the first voltage supply 110. For the bipolar electrodes, separate electrical connectors 90 are used to separately electrically connect the first group of electrodes 146 to the first power bus 40a, and connect the second group of electrodes 148 to the second power bus 40b. For both monopolar and bipolar electrodes, the electrical connectors 90 are substantially identical, and to avoid repetition will only be described once. The electrical connector 90 comprises an electrical lead 95 that extends through the bore 85 in the base 80, and an electrical contact 100. Typically, the length of the electrical lead 95 is from about 10 mm to about 50 mm, and the width of the electrical lead 95 is from about 2 mm to about 10 mm. Preferably, the electrical contact 100 is disk-shaped with an exposed area sized to directly contact and electrically engage a voltage supply terminal 105, the area preferably being from about 50 to about 400 mm$^2$.

Each fuse 50 is self-operating and capable of electrically disconnecting at least one electrode 25 from an output terminal of the power bus when a current exceeding the amperage rating of the fuse flows through the electrode 25 and contiguous fuse 50. The fuses 50 are current-sensitive elements capable of automatically electrically disconnecting the electrode 25 from the output terminal 45 during large current surges that arise from discharge of plasma when the insulator 30 punctures and exposes an electrode 25 to the process environment. Discharge of the plasma through the electrode 25 and contiguous fuse 50 causes the fuse to switch-off, for example by melting or burning out. Typically, each fuse comprises a conductor having a reduced cross-section surrounded by an insulator. The ampere rating of the fuse 50 is the current the fuse can carry without burning-out, melting, or exceeding specific temperature rise limits. The interrupting rating of the fuse 50 is the maximum short-circuit current that a fuse can safely interrupt. An instantaneous rise in current causes the fuse to switch-off usually in less than a quarter of a cycle. Preferably, each fuse 50 is capable of electrically disconnecting an electrode 25 from an output terminal 45 when a current of at least about 300 microamps, more typically at least about 500 microamps, and most typically at least about 1 milliamp, flows through the fuse 50. Preferably, the fuse should be constructed to burn-out quickly in less than about 100 milliseconds, and more preferably in less than 10 milliseconds.

In a preferred configuration, each fuse 50 comprises a resistive wire or layer between the electrode and power bus, that has a resistance of at least about 100 Ω, more preferably from about 100 to 3000 Ω, and most preferably about 300 Ω. The resistor can comprise a thin lead or layer of a resistive material connecting an electrode 25 to an output terminal 45 of power bus 40. It should be understood that the resistor can be made of a conductive or resistive material, because the resistance of a conductor is given by the formula R=ρ×(I/A), where ρ is the resistance per unit length, I is the length, and A is the area of the element. Thus, even highly conductive material can operate as a resistor if the length of the material is suitably long or its area sufficiently small. For example, the resistor can comprise a conductive metal, such as copper or aluminum, formed as a very thin lead or layer connecting an electrode 25 to an output terminal 45. Alternatively, the resistor can be fabricated from conventional resistive materials, including carbon, nickel, phosphorous, chromium, tin, and mixtures thereof. Preferably, the resistor material is fabricated from nickel-phosphorous, nickel-chromium, chromium, or tin, which are highly current sensitive materials.

The shape and size of the fuse 50, namely the length, width, diameter, or thickness of the fuse is dependent upon the fuse material and the amperage of the current flowing through the fuse. For example, a suitable thickness for a resistor fuse 50 constructed from a resistive material such as nickel-phosphorous, nickel-chromium, chromium or tin, and having an ampere rating of about 50 mA is from about 0.005 to about 1 μm, and more preferably from about 0.01 to about 0.2 μm. In a preferred configuration, the fuse comprises a thin lead of resistive material connecting an electrode 25 to an output terminal 45 over a power bus 40. The thin lead burns out or melts when the ampere rating of the current flowing through the resistive lead exceeds the maximum current that the fuse can conduct without burning out or melting, as described above. Furthermore, for fuses having thicknesses of the about 0.01 to about 0.2 μm, a preferred width is from about 0.1 to about 1 mm, and more preferably from 0.1 to 0.3 mm (0.005 to 0.012 inch); and a preferred length is from about 0.1 to 5 mm, and more preferably, from 0.5 to 2.5 mm (0.02 to 0.1 inch). The resistive fuse element 50 can be embedded in the insulator 30 surrounding the electrodes 25, or can be constructed as a separate insulated fuse assembly, as described in more detail below.

Figure 5:
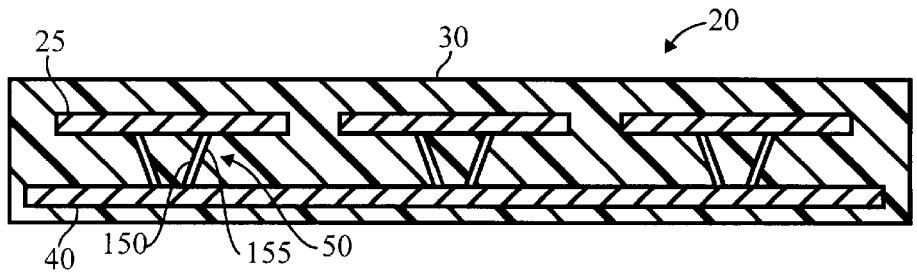
FIG. 5 is a cross-sectional schematic side view of another embodiment of an electrostatic chuck according to the present invention.

The electrical power bus 40 is embedded in insulator and can comprise an electrical conductor wire or layer spaced apart from the electrodes 25. The electrical power bus 40 has output terminals 45 or junctions that provide electrical voltage to the electrodes 25. The output terminals 45 of the electrical power bus 40 can be positioned below the electrodes 25, as shown in FIG. 5, or positioned coplanar to and between the electrodes 25, as shown in FIG. 6. Alternatively, the output terminals 45 and the electrical power bus 40 can be located in a different structure, or remote from the chuck 20, as shown in FIG. 7.

Methods of manufacturing the electrodes 25, electrical power bus 40, fuses 50, and the hollow cavities 55 of the chuck will now be described. Preferably, the chuck is shaped as a laminate composed of insulator 30 and having the electrodes 25, electrical power bus 40, and fuses 50 embedded therein. In one method of fabrication, schematically illustrated in FIGS. 9a to 9g, a composite layer is formed by (i) selecting a first insulator support layer 30a; (ii) depositing a resistor layer 200 on the first insulator layer 30a to form the fuses therefrom; and (iii) depositing a patterned electrical conductor layer 205 over the resistor layer 200, to form the electrodes 25 and power bus 40. The support layer 30a can comprise commercially available polymer films such as "KAPTON," a polyimide film manufactured by DuPont de Nemours Co., in Wilmington, Del.; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; or "SUPERIOR FILM" fabricated by Mitsubishi Plastics Indus. Ltd., Japan.

Figure 9A:
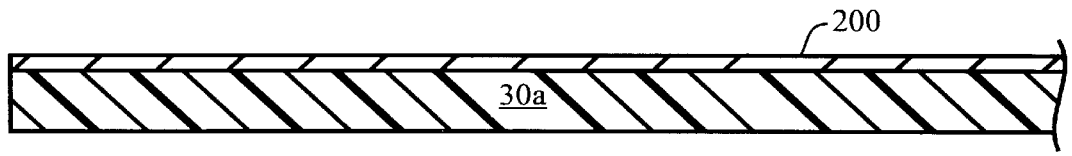
FIGS. 9a to 9g are sectional schematic side views showing successive steps in the fabrication of an electrostatic chuck according to the present invention.
Figure 9B:
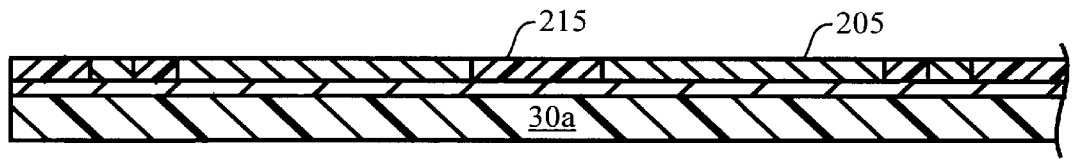
Figure 9C:
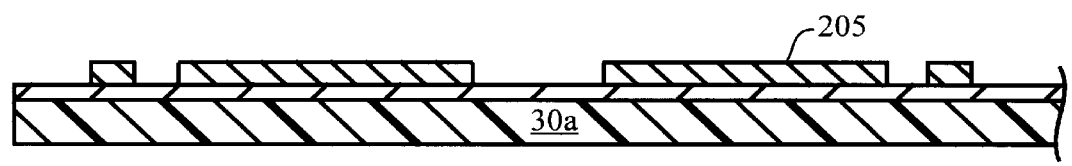

Preferably, the resistor layer 200 can be formed by depositing a thin layer of a conductive or resistive material, preferably, nickel-phosphorous, nickel-chromium, chromium, or tin, on the first insulator layer 30a, as shown in FIG. 9a. The thickness of the resistor layer is from about 0.005 to about 1 μm. A first patterned resist layer 215 is formed on the resistor layer 200, the resist layer 215 being patterned to the electrode 25 and electrical power bus 40 configurations, as shown in FIG. 9b. The resist can comprise hard mask or photoresist materials, such as "RISTON" fabricated by DuPont de Nemours Chemical Co., Wilmington, Del. Conventional photolithographic methods, such as those described in Silicon Processing for the VLSI Era, Volume 1: Process Technology, Chapters 12, 13, and 14, by Stanley Wolf and Richard N. Tauber, Lattice Press, Calif. (1986), which is incorporated herein by reference, can be used to pattern the resist layer 215 to correspond to the shape of the electrodes 25 and electrical power bus 40. Thereafter, electroplating is used to deposit an electrical conductor layer 205 between the resist coated portions, to form the electrodes 25, electrical power bus 40, and electrical connector 90. The electrical conductor layer 205 is deposited to a thickness of 2 μm to 100 μm, and more preferably about 5 μm. The electrical conductor layer 205 can also be deposited by sputtering a copper layer on the insulator film with a chromium oxide bonding layer therebetween. The vapor deposition method is advantageous by allowing deposition of a thin electrode layer that has a thickness of less than about 500 nm, and more preferably less than 250 nm. After depositing the electrical conductor layer 205, residual photoresist is stripped from the composite layer using a conventional acid or oxygen plasma stripping process to obtain the structure shown in FIG. 9c.

Figure 9D:
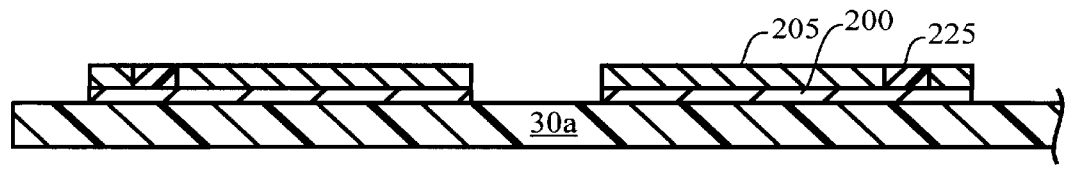
Figure 9E:
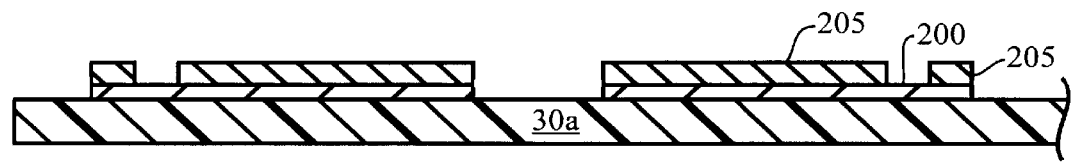

Thereafter, a second patterned resist layer 220 is formed on the resistor layer 200, as shown in FIG. 9d, the patterned resist features corresponding to the desired fuse 50 configuration. Exposed portions of the resistor layer 200 are then etched using conventional etching methods to form resistive fuses 50 connecting the electrodes 25 to the electrical power bus 40, as shown in FIG. 9e. Conventional wet or dry chemical etching methods can be used to etch the resistor layer 200. A suitable wet chemical etching method comprises immersing the composite film into an etchant such as ferric chloride, sodium persulfate, or an acid or base, until the film is etched. Suitable dry etching processes are described in Silicon Processing, Chapter 16, supra, which is incorporated herein by reference.

Figure 9F:
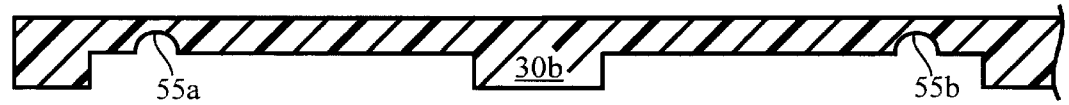
Figure 9G:
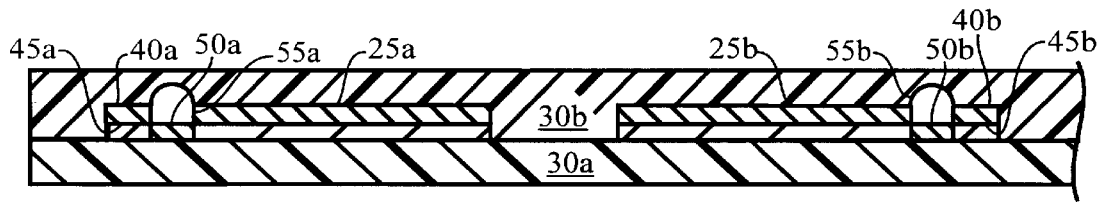

A cover layer 30b is formed with hollow cavities 55a, 55b sized and configured to be disposed over the fuses 50 as shown in FIG. 9f. The cover layer 30b can comprise one or more layers of adhesive and/or insulation. The hollow cavities in the cover layer 30b can be formed by machining, stamping, casting or a photolithography and etching process similar to that described above form the fuses 50.

The electrical connector 90 of the electrostatic chuck 20 is typically formed as an integral extension of the electrodes 25 by stamping, punching, or pressing out the electrical connector 90 from the laminate. Preferably, the electrical connector 90 is cut out so that the electrical lead 95 and contact 100 are disposed within one of the grooves 145. After cutting out the electrical connector 90, the insulator 30 on the electrical contact is removed to expose the underlying electrically conductor layer 205 which forms the electrical contact 100. The electrical lead 95 and electrical contact 100 are inserted through the bore in the base 80 so that the electrical contact 100 is disposed below the base 80 as shown in FIG. 2. The chuck laminate structure is adhered to the base 80 of the chuck 20, using conventional pressure or temperature sensitive adhesives, such as polyimides. A top view of the resultant chuck 20 is shown in FIGS. 10a and 10b.

Instead of fabricating the composite laminate layer, a commercially available composite multi-layer film comprising a first insulator layer 30 having thereon (i) a resistor layer 200, and (ii) an electrical conductor layer 205, can also be used. A suitable multilayer film comprises a "R/FLEX 1100" film fabricated by Rogers Corporation, Chandler, Ariz., comprising a 125 μm thick polyimide insulator layer 30a; a 0.1 μm resistor layer 200; and a 25 μm electrically conductive copper layer 205. Another suitable multilayer film is "81G3365" film fabricated by IBM Corporation, of Endicott, N.Y. The resistor layer 200 is etched or milled to form the resistive fuses 50, and the copper layer is etched or milled to form the electrodes 25, the integral electrical connector 90, and electrical power bus 40, as described above. Thereafter, a second insulator layer 30b is adhered over the etched laminate structure to form the chuck 20.

The electrostatic chuck 20 having features of the present invention has several advantages. First, the chuck is resistant to failures occurring from erosion or puncture of the insulator 30 on the electrodes 25. The current flowing through a fuse 50 as a result of the electrostatic discharge through an exposed electrode 25 causes the fuse 50 to electrically disconnect the exposed electrode 25 in a relatively short time. This allows the remaining insulated electrodes 25 (or electrode segments) to continue to operate and electrostatically hold the substrate 35. Thus, each fuse 50 and electrode 25 assembly of the present invention functions as an independently operated micro chuck. In this manner, the electrostatic chuck 20 of the present invention resists catastrophic failure even when insulator 30 covering an electrode 25 is punctured or eroded. Furthermore, the enclosed cavities 55 surrounding the fuses reduce the possibility of burn-out residue or melt residue from the fuses to form conducting pathways or linkages between the electrode 25 and the output terminal of the power bus.

In another aspect the present invention provides a system for early detection, and optional counting, of the number of electrode 25 failures using a current detector 175, and optional counter 180, electrically connected in series to the electrical power bus 40 to detect flow of current through the fuses 50. Monitoring of the current surges through the current detector 175 provides an indication of the number of electrodes 25 exposed to the process environment or the number of disconnected electrodes 25. In this manner, the current detector 175 and counter 180 can be used to provide early warning of the failure of one or more electrodes 25, to allow replacement of the chuck before the chuck catastrophically fails during a processing cycle.

EXAMPLES

The following comparative examples show the advantages of a failure resistant electrostatic chuck 20 of the present invention in which a fuse 50 was enclosed in a hollow cavity 55 in the insulator 30. In both examples, the fuse 50 was made of a 0.2 $\mu$m thick nickel-phosphorous, and the length of the fuse were varied from about 0.3 to about 3 mm ($\cong$0.01 to 0.1 inches). The copper electrode 25 and power bus 40 structure were fabricated by a subtractive etch process from a copper layer 18 $\mu$m thick deposited on a 50 $\mu$m thick supporting dielectric layer. To test the fuse 50 structures, the power bus 40 was connected to one terminal of a DC power supply while the copper electrode 25 was electrically contacted with a needle probe that pierced the supporting dielectric layer 30a and was connected to the other terminal of the power supply.

The first example demonstrates the effect of continued application of DC voltage on a fuse structure in which the fuse 50 was not enclosed in a hollow cavity 55. In this example, the electrode and fuse patterns were covered with a single, solid, polyimide layer about 50 $\mu$m thick. When potentials of between 1000 and 2000 volts DC were applied between the power bus 40 and copper electrode 25 (to replicate the discharge of a plasma in a plasma process) a large current flowed through the fuse 50. The large current load caused the fuse 50 to burn-out. However, it was determined that sporadic arcing continued to occur across the fuse gap along the oxidized residue of the burnt fuse 50, even though the fuse was burned out.

In the second example, an electrostatic chuck 20 was fabricated according to FIG. 3a and 3c. The fuse 50 elements, electrodes 25 and polyimide dielectrics were identical to those of the preceding example with the following exception. The cover layer was made of two 25 $\mu$m thick polyimide layers 30b–c, and of these, the polyimide layer closest to the fuse had a hole having a diameter about the same size as the fuse length. Thus a hollow cavity was formed in the insulator in the shape of a cylinder with an outer diameter of about 1.5 mm ($\cong$60 mils) (equal to about the length of the fuse 50) and a height of about 25 $\mu$m ($\cong$1 mils) (equal to about half the combined thickness of the cover layers). When fuses 50 of various lengths were tested under the same conditions as in the preceding example, these fuses were found to burn out and switch off at the first application of DC voltage, and in every case, continued application of the DC potential did not lead to further arcing across the fuse gap.

In a third example, the fuse 50 was made of nickel-phosphorous and comprised a thickness of about 0.2 $\mu$m ($\cong$0.01 mils), and a length of about 1 mm ($\cong$40 mils). The shape and size of the fuse was selected to electrically disconnect the electrode from the output terminal of the power bus when a current of at least about 10 mA flows through the fuse. The copper electrode 25 and power bus 40 structure were fabricated by a subtractive etch process from a thin sheet of multilayer foil 195 having a thickness of from about 1.8 to about 185 $\mu$m ($\cong$0.07 to 7.1 mil) joined to a supporting layer 30a having a thickness of from about 5 to about 500 $\mu$m ($\cong$0.2 to 20 mil). The multilayer foil 195 comprising a resistor layer 200 from about 0.025 to about 2.5 $\mu$m thick ($\cong$0.001 to 0.1 mil) and an electrical conductor layer 205 from about 1.8 to about 180 $\mu$m thick ($\cong$0.07 to 7 mil). Preferably, the resistor layer 200 and the electrical conductor layer 205 are made from a thin sheet of multilayer foil 195, such as for example, ½ oz weight A100 Ohmega® foil available from Ohmega Technologies, Culver City, Calif., and comprising a layer of copper having a thickness of about 17 $\mu$m ($\cong$0.7 mils) that is plated on one side with a layer of NiP having a thickness of about 0.3 $\mu$m ($\cong$0.01 mils). To test the fuse 50 structures, the power bus 40 was connected to one terminal of a DC power supply while the copper electrode 25 was electrically contacted with a needle probe that pierced the supporting dielectric layer 30a and was connected to the other terminal of the power supply.

Figure 13:
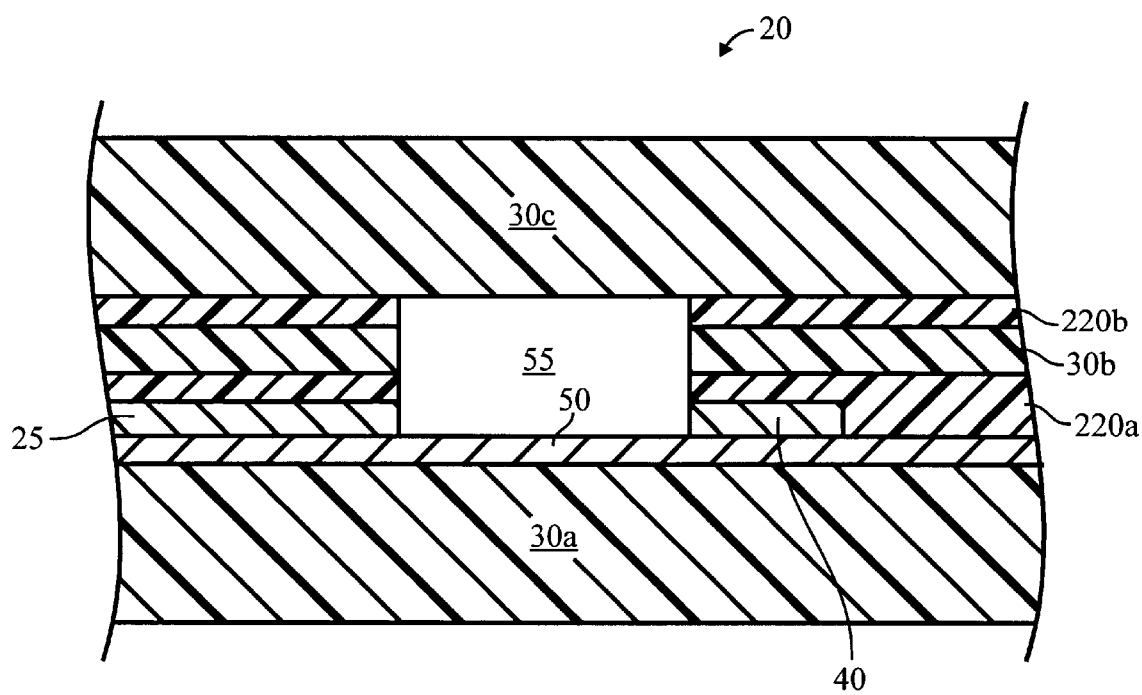
FIG. 13 is a partial sectional schematic side view of another version of the electrostatic chuck of the present invention showing a plurality of adhesive and polymeric layers forming the insulator and a cylindrical hollow cavity in the insulator layers.

As shown in FIG. 13, the electrostatic chuck 20 comprises a plurality of insulating layers 30a–c and adhesive layers 220a,b. This makes the chuck 20 easier to fabricate by allowing joining of the insulating layers 30a–c without a separate step of applying liquid adhesive on the layers, and without requiring excessively high temperatures to laminate the layers together. The insulator 30 comprises a support layer 30a which supports the electrodes 25, power bus 40, and fuses 50. A cover layer 30b comprising a plurality of hollow cavities 55 is bonded over the electrodes 25, power bus 40, output terminals 45, and fuses 50, by an adhesive layer 220a. A second adhesive layer 220b bonds a third insulating layer 30c to the cover layer 30b.

Figure 14:
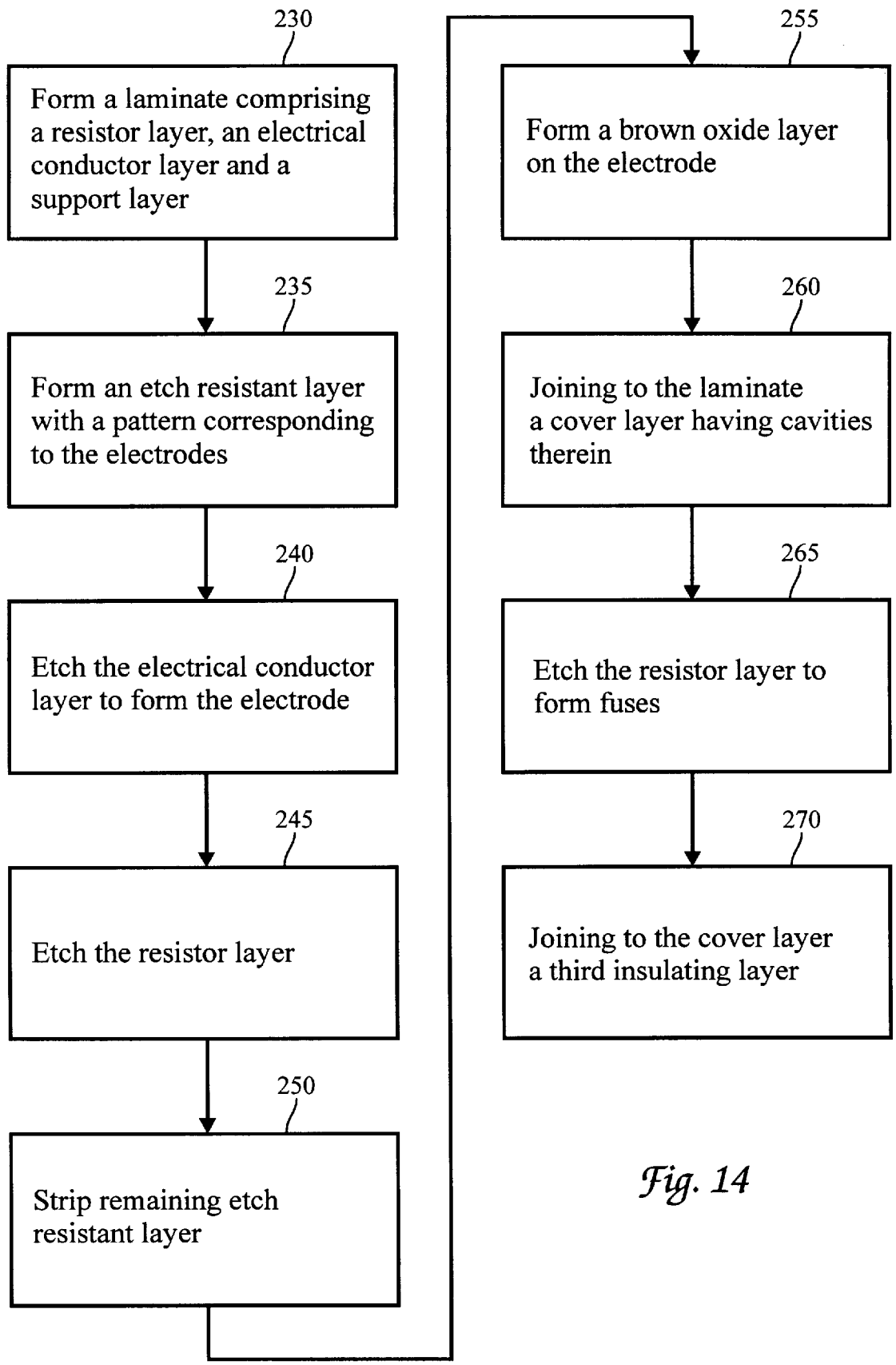
FIG. 14 is a flow chart illustrating the steps of forming one version of the electrostatic chuck of the present invention.
Figure 15A:
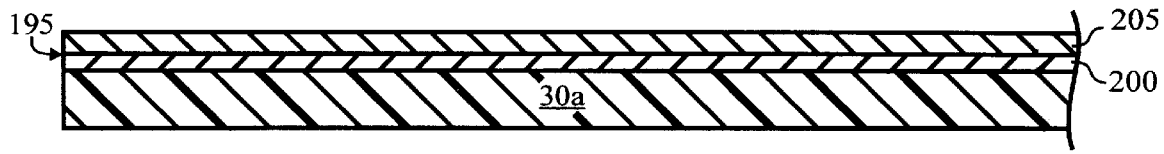
FIGS. 15a to 15f are sectional schematic side views showing successive steps in the fabrication of a version of the electrostatic chuck according to the present invention.

A method of fabricating the chuck 20 of FIG. 13 will now be described. Referring to the flow chart of FIG. 14, in a first step 230, a laminate is formed of a support layer 30a, an electrical conductor layer 205, and a resistor layer 200. The laminate, shown in FIG. 15a, is formed by selecting a support layer 30a; placing a multilayer foil 195 comprising a resistor layer 200 and an electrical conductor layer 205 on the support layer 30a; and applying pressure and heat to join the resistor layer 200 and the electrical conductor layer 205 to the support layer 30a. Preferably, the pressure is applied using a pressure forming apparatus, such as an autoclave, platen press, or isostatic press. More preferably, a pressure of from about 700 to about 2000 kPa, and a temperature of from about 100 to about 400° C. is applied to the assembled layers for about 60 minutes. The support layer 30a can comprise commercially available polymer films such as described above.

Figure 15B:
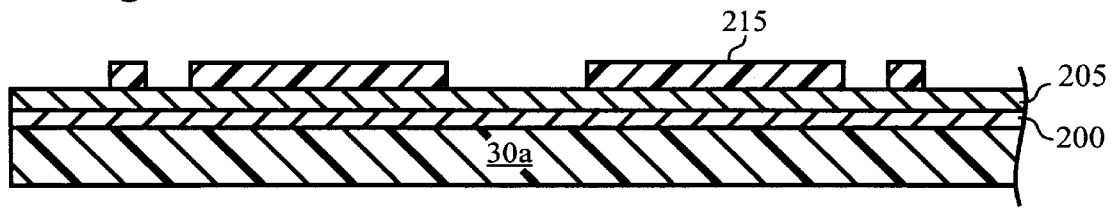
Figure 15C:
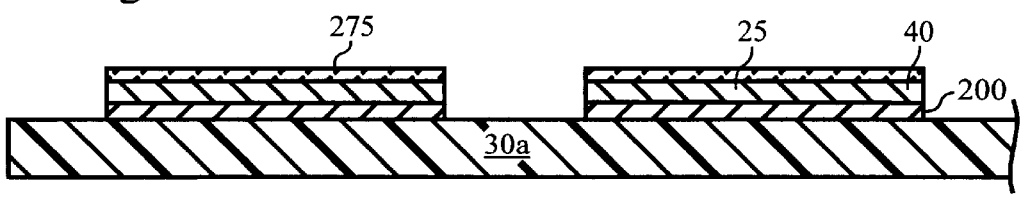
Figure 15D:
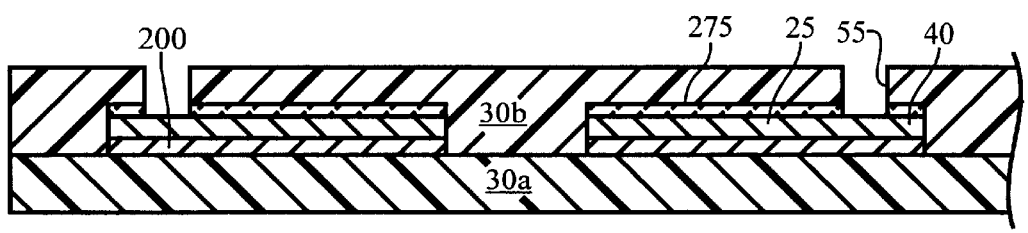

In a second step 235, a resist layer 215 is deposited on the foil 195 and patterned to correspond to the configurations of the electrodes 25 and electrical power bus 40, as shown in FIG. 15b. Next, in a first etch step 240 a wet etching process is used to partially remove the electrical conductor layer 205 between the resist coated portions to form the electrodes 25 and the electrical power bus 40. The resistor layer 200 is partially removed in a second etch step 245. Thereafter, the remnant resist is removed in a stripping step 250 to clean the exposed surface of the electrical conductor layer 205 and the support layer 30a, as shown in FIG. 15c. The exposed surface of the electrical conductor layer 205 can then be treated in an oxide forming step 255 to form a brown oxide layer 275. The brown oxide layer 275 is desirable to enhance the adhesion of the overlying layers to the electrical conductor layer 205.

Figure 15E:
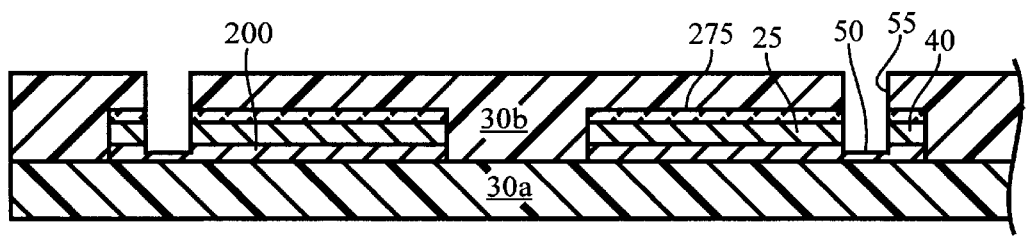
Figure 15F:
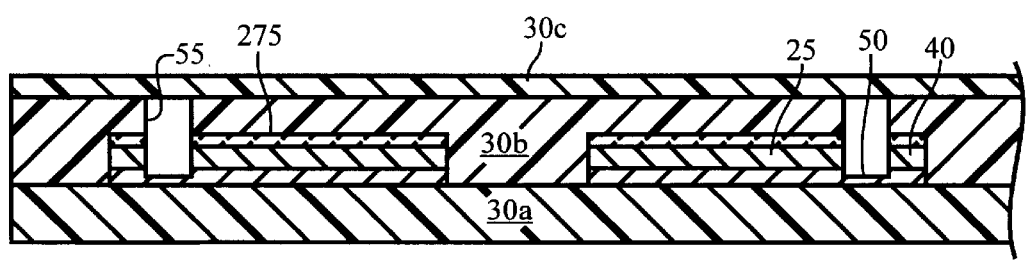

A cover layer 30b having cavities 55 formed therein is joined to the support layer 30a in a second lamination step 260 using the adhesion layer 220a and the lamination process described above. The hollow cavities in the cover layer 30b can be formed by machining, stamping, casting, photolithography, or etching processes. The underlying foil 195 exposed by the cavities 55 is then etched in a wet etch step 265 to form resistive fuses 50 having the desired size and shape, and which connect the electrodes 25 to the electrical power bus 40, as shown in FIG. 15e. Thereafter, the surface of the cover layer 30b, the fuses 50 and the exposed portions of the support layer 30a are cleaned; and in a final laminating step 270 a third insulating layer 30c is joined to the cover layer 30b, as shown in FIG. 15f.

Although the present invention has been described in considerable detail with reference to certain preferred versions, many other versions should be apparent to those skilled in the art. Therefore, the spirit and scope of the appended claims should not be limited to the description of the preferred versions contained herein.

What is claimed is:

1. An electrostatic chuck comprising an insulator having a surface for receiving a substrate thereon, the insulator having embedded therein:
   (a) an electrode for electrostatically holding the substrate upon application of a voltage to the electrode;
   (b) an electrical power bus having an output terminal for conducting the voltage to the electrode; and
   (c) a fuse connecting in series the electrode to the output terminal from the power bus, the fuse positioned within a hollow cavity in the insulator.

2. The electrostatic chuck of claim 1, wherein the hollow cavity in the insulator comprises a surface area sized sufficiently large to receive debris from burn-out of the fuse without forming a conductive pathway between the electrode and the output terminal of the power bus.

3. The electrostatic chuck of claim 1, wherein the hollow cavity in the insulator comprises at least one of the following characteristics:
   (a) a width of about 0.25 to about 5 times a length of the fuse;
   (b) a surface area of about 0.001 to about 100 mm$^2$; or
   (c) a circular shape having a diameter of about 1 to about 5 mm.

4. The electrostatic chuck of claim 1, wherein the insulator comprises a first layer supporting the fuse and a second layer having the hollow cavity therein aligned over the fuse.

5. The electrostatic chuck of claim 1, wherein the insulator comprises a first insulating layer supporting the fuse, a second adhesive layer having a hollow cavity aligned over the fuse, and a third insulating layer covering the adhesive layer.

6. The electrostatic chuck of claim 1, wherein the electrostatic chuck is operated in a plasma process environment, and wherein the fuse comprises an amperage rating sufficiently low to electrically disconnect the electrode from the output terminal when a plasma current discharge flows through the fuse.

7. The electrostatic chuck of claim 1, wherein the fuse comprises at least one of the following characteristics:
   (1) the fuse electrically disconnects the electrode from the output terminal of the power bus when a current of at least about 10 mA flows through the fuse;
   (2) the fuse burns out in less than about 10 milliseconds;
   (3) the fuse comprises a resistor having a resistance of at least about 100 Ω;
   (4) the fuse comprises one or more of carbon, nickel, phosphorous, nickel-phosphorous, nickel-chromium, chromium, and tin; or
   (5) the fuse comprises a resistor having at least one of the following dimensions (i) a thickness of from about 0.02 μm to about 25 μm, (ii) a width of from about 10 to about 500 μm; or (iii) a length of from about 500 to 2000μ.

8. The electrostatic chuck of claim 1, wherein the electrode comprises first and second electrodes sized and configured to operate as bipolar electrodes, each electrode connected via a fuse to an output terminal of the power bus.

9. A process chamber comprising the electrostatic chuck of claim 1, the process chamber further comprising:
   (a) a gas distributor; and
   (b) an exhaust,
whereby a substrate held on the electrostatic chuck is capable of being processed by gas distributed by the gas distributor and exhausted by the exhaust.

10. An electrostatic chuck for holding a substrate in a process environment, the electrostatic chuck comprising an insulator having a surface for receiving the substrate thereon, and the insulator having embedded therein:
   (a) a plurality of electrodes for electrostatically holding the substrate upon application of a voltage to the electrodes;
   (b) an electrical power bus having a plurality of output terminals for conducting the voltage to the electrodes; and
   (c) a plurality of fuses, each fuse connecting in series at least one electrode to an output terminal from the power bus, and each fuse positioned within a hollow cavity in the insulator.

11. The electrostatic chuck of claim 10, wherein each hollow cavity in the insulator comprises a surface area sized sufficiently large to receive debris from burn-out of a fuse without forming a conductive pathway between the electrode and the output terminal of the power bus.

12. The electrostatic chuck of claim 10, wherein each hollow cavity in the insulator comprises at least one of the following characteristics:
   (a) a width of about 0.25 to about 5 times a length of the fuse;
   (b) a surface area of about 0.001 to about 100 mm$^2$; or
   (c) a circular shape having a diameter of about 1 to about 5 mm.

13. The electrostatic chuck of claim 10, wherein the insulator comprises a first layer supporting the fuses and a second layer having the hollow cavities therein aligned over the fuses.

14. A method of using the electrostatic chuck of claim 10 comprising the step of applying a voltage to the electrodes in the electrostatic chuck to electrostatically hold the substrate in a process chamber for processing the substrate in a plasma.

15. A process chamber comprising the electrostatic chuck of claim 10, the process chamber further comprising:
   (a) a gas distributor; and
   (b) an exhaust,
whereby a substrate held on the electrostatic chuck is capable of being processed by gas distributed by the gas distributor and exhausted by the exhaust.

16. An electrostatic chuck for holding a substrate in a process environment, the electrostatic chuck comprising:
(a) a support layer supporting (i) a plurality of electrodes for electrostatically holding the substrate upon application of a voltage to the electrodes, (ii) an electrical power bus having a plurality of output terminals for conducting the voltage to the electrodes, and (iii) a plurality of fuses, each fuse connecting in series at least one electrode to an output terminal of the power bus; and
(b) a cover layer on the support layer, the upper surface of the cover layer comprising insulator for insulating the electrodes, and the lower surface of the cover layer comprising hollow cavities positioned around the fuses on the support layer.

17. The electrostatic chuck of claim 16, wherein each hollow cavity in the cover layer comprises a surface area sized sufficiently large to receive debris from burn-out of a fuse without forming a conductive pathway between the electrode and the output terminal of the power bus.

18. The electrostatic chuck of claim 16, wherein the hollow cavities in the insulator comprise at least one of the following characteristics:
(a) a width of about 0.25 to about 5 times a length of the fuse;
(b) a surface area of about 0.001 to about 100 mm$^2$; or
(c) a circular shape having a diameter of about 1 to 5 mm.

19. The electrostatic chuck of claim 16, wherein the electrostatic chuck is operated in a plasma process environment, and wherein each fuse comprises an amperage rating sufficiently low to electrically disconnect the electrode from the output terminal, when the insulator punctures to expose the electrode to the process environment causing a current discharge from the plasma to flow through the fuse.

20. A process chamber comprising the electrostatic chuck of claim 16, the process chamber further comprising:
(a) a gas distributor; and
(b) an exhaust,
whereby a substrate held on the electrostatic chuck is capable of being processed by gas distributed by the gas distributor and exhausted by the exhaust.

21. The electrostatic chuck of claim 16, wherein the cover layer comprises a lower layer having the hollow cavities extending therethrough and an upper layer covering the cavities.

22. The electrostatic chuck of claim 21, further comprising an adhesive layer between the lower layer and the upper layer of the cover layer.

23. The electrostatic chuck of claim 22, wherein the electrodes comprise an about 17 $\mu$m thick layer of copper.

24. A method of forming an electrostatic chuck comprising a plurality of electrodes connected via fuses to output terminals of an electrical power bus, the method comprising the steps of:
(a) forming a plurality of electrodes, an electrical power bus having output terminals, and fuses on an insulating support layer; and
(b) forming hollow cavities in an insulating cover layer; and
(c) joining the insulating cover layer to the insulating support layer so that each hollow cavity is aligned over a fuse.

25. The method of claim 24, wherein the cover layer comprises one or more of adhesive and insulator layers, and wherein step (c) comprises adhering the cover layer to the support layer.

26. The method of claim 24, wherein step (a) comprises the steps of (i) depositing layers of electrical conductor and resistor material on the insulating support layer, and (ii) etching the conductor or resistor layer to form a plurality of electrodes, each electrode connected to an output terminal from a power bus via a fuse.

27. The method of claim 24, wherein step (b) comprises the step of forming hollow cavities comprising a surface area sufficiently large to receive debris from burn-out of a fuse without forming a conductive pathway between the electrode and the output terminal of the power bus.

28. The method of claim 24, wherein step (b) comprises the step of forming hollow cavities comprising at least one of the following characteristics:
(a) a width of about 0.25 to about 5 times the length of the fuse;
(b) a surface area of about 0.001 to about 100 mm$^2$; or
(c) a circular shape having a diameter of about 1 to about 5 mm.

29. The method of claim 24, wherein step (a) comprises providing a laminate comprising a resistor layer and an electrical conductor layer, and etching the electrical conductor layer to form the electrodes.

30. The method of claim 29 wherein step (b) comprises forming hollow cavities through the insulating cover layer.

31. The method of claim 30 further comprising the step of adhering an additional layer to the cover layer to cover the cavities.

32. The method of claim 31 wherein step (a) comprises forming the electrodes from an electrical conductor layer having a thickness of about 17 $\mu$m.

* * * * *